United States Patent
Ahn et al.

(10) Patent No.: US 9,874,789 B2
(45) Date of Patent: Jan. 23, 2018

(54) THIN FILM TRANSISTOR DISPLAY PANEL AND LIQUID CRYSTAL DISPLAY

(71) Applicant: Samsung Display Co., Ltd., Yongin, Gyeonggi-Do (KR)

(72) Inventors: Kyu Su Ahn, Seoul (KR); Hee Hwan Lee, Hwaseong-si (KR); Kyung Ho Kim, Seongnam-si (KR); Kee Bum Park, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 106 days.

(21) Appl. No.: 14/663,277

(22) Filed: Mar. 19, 2015

(65) Prior Publication Data

US 2016/0161806 A1    Jun. 9, 2016

(30) Foreign Application Priority Data

Dec. 3, 2014   (KR) .................... 10-2014-0172360

(51) Int. Cl.
  *G02F 1/1343*    (2006.01)
  *G02F 1/1337*    (2006.01)
  (Continued)

(52) U.S. Cl.
  CPC ...... *G02F 1/134309* (2013.01); *H01L 27/124* (2013.01); *H01L 29/42356* (2013.01);
  (Continued)

(58) Field of Classification Search
  CPC ............. G02F 1/134309; G02F 1/1368; G02F 1/13624; G02F 1/133703;
  (Continued)

(56) References Cited

U.S. PATENT DOCUMENTS 8,059,243 B2 * 11/2011 Kim ...................... G02F 1/1393
                                                     349/129
2012/0075562 A1 * 3/2012 Yeh ....................... G02F 1/1323
                                                     349/139
(Continued)

FOREIGN PATENT DOCUMENTS

KR    10-2010-0061120    6/2010
KR    10-2013-0034360    4/2013
KR    10-2013-0125638    11/2013

*Primary Examiner* — Angela Davison
(74) *Attorney, Agent, or Firm* — Innovation Counsel LLP

(57) ABSTRACT

A thin film transistor according to the present inventive concept includes: a first and a second pixel electrodes that are electrically connected to the drain electrode through the contact hole and disposed to be adjacent to each other in a column direction, wherein the first pixel electrode includes a first sub-pixel electrode and a second sub-pixel electrode that include a vertical stem part, a horizontal stem part, and a plurality of minute branches, the second pixel electrode includes a third sub-pixel electrode and a fourth sub-pixel electrode that include a vertical stem part, a horizontal stem part, and a plurality of minute branches, and the plurality of minute branches of the second sub-pixel electrode and the plurality of minute branches of the third sub-pixel electrode that are adjacent to each other to each other in the column direction form an angle of 45° or more to 135° or less.

16 Claims, 23 Drawing Sheets

(51) Int. Cl.
  *H01L 27/12* (2006.01)
  *H01L 29/423* (2006.01)
(52) U.S. Cl.
  CPC ............... *G02F 1/133707* (2013.01); *G02F 2001/133757* (2013.01); *G02F 2001/134345* (2013.01)
(58) Field of Classification Search
  CPC ... G02F 2001/134345; G02F 2201/123; G02F 2201/124; G02F 1/133707; G02F 2001/133757; H01L 27/124; H01L 29/42356
  USPC .................................. 349/139, 141, 144, 48
  See application file for complete search history.

(56) References Cited

U.S. PATENT DOCUMENTS

2012/0113344 A1* 5/2012 Kim .................... G02F 1/13338
    349/41
2012/0249940 A1* 10/2012 Choi ................. G02F 1/133753
    349/123
2013/0063686 A1* 3/2013 Tashiro ............. G02F 1/133707
    349/98

* cited by examiner

FIG. 10
| | COMPARATIVE EXAMPLE | EXEMPLARY EMBODIMENT |
|---|---|---|
| TRANSMITTANCE | Ref | +8.8% |
| TEXTURE DEFECT | LEVEL 3 | LEVEL 2 |
| VISIBILITY | 0.326 | 0.316 |
| Scope image (0/90) | 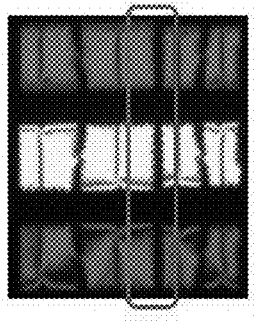 | 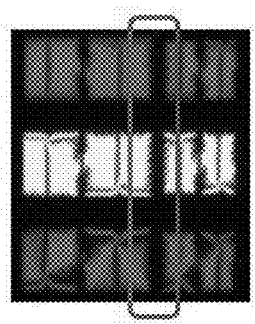 |

THIN FILM TRANSISTOR DISPLAY PANEL AND LIQUID CRYSTAL DISPLAY

CROSS-REFERENCE TO RELATED APPLICATION

This application claims priority to and the benefit of Korean Patent Application No. 10-2014-0172360 filed in the Korean Intellectual Property Office on Dec. 3, 2014, the entire contents of which are incorporated herein by reference.

BACKGROUND (a) Field

The present inventive concept relates to a thin film transistor display panel and a liquid crystal display using the same.

(b) Description of the Related Art

A liquid crystal display, which is one of the most widely used displays, includes two substrates on which electric field generating electrodes such as a pixel electrode, a common electrode, and the like are formed, and a liquid crystal layer interposed therebetween. The liquid crystal display displays an image by applying a voltage to the electric field generating electrodes to generate an electric field on the liquid crystal layer and consequently, determining an orientation of liquid crystal molecules in the liquid crystal layer and controlling polarization of incident light.

As the liquid crystal display is used as a display of a television receiver, a size of a screen thereof is gradually increased. Due to an increase in size of the liquid crystal display, a difference in images between a center portion and side portions of the liquid crystal display may be increased when a viewer watches the liquid crystal display.

In order to compensate for the difference in images described above, the display may be formed in a curved shape by bending it to a concave shape or a convex shape. The display may be a portrait type having a height longer than a width and bent in a vertical direction, and may also be a landscape type having the height shorter than the width and bent in a horizontal direction, based on the viewer.

However, when forming the curved liquid crystal display by bending it, shear stress is applied to a substrate, which is disposed inside a curved surface, among two substrates. Therefore, a texture due to misalignment of upper and lower substrates may occur. The texture may occur in a region in which unit pixel electrodes are adjacent to each other in a column direction.

The above information disclosed in this Background section is only for enhancement of understanding of the background of the inventive concept and therefore it may contain information that does not form the prior art.

SUMMARY

The present inventive concept has been made in an effort to provide a thin film transistor display panel and a liquid crystal display including the same having advantages of improving texture which has occurred upon implementing a curved type panel by horizontally disposing pixel electrodes.

An exemplary embodiment of the present inventive concept provides a thin film transistor display panel, including: a first substrate; and a first pixel electrode and a second pixel electrode formed on the first substrate and disposed to be adjacent to each other in a column direction, wherein the first pixel electrode includes a first sub-pixel electrode and a second sub-pixel electrode that include a vertical stem part, a horizontal stem part, and a plurality of minute branches, the second pixel electrode includes a third sub-pixel electrode and a fourth sub-pixel electrode that include a vertical stem part, a horizontal stem part, and a plurality of minute branches, and the plurality of minute branches of the second sub-pixel electrode and the plurality of minute branches of the third sub-pixel electrode that are adjacent to each other in the column direction form an angle greater than or equal to 45° and less than or equal to 135°.

The thin film transistor display panel may further include: a gate line formed on the first substrate; a gate insulating layer formed on a gate line; a semiconductor layer formed on the gate insulating layer; a data line and a drain electrode formed on the semiconductor layer; and a passivation layer covering the data line and the drain electrode and having a contact hole exposing a portion of the drain electrode, wherein the first pixel electrode has the first sub-pixel electrode disposed above the gate line and the second sub-pixel electrode disposed below the gate line, and the second pixel electrode has the third sub-pixel electrode disposed above the gate line and the fourth sub-pixel electrode disposed below the gate line.

The first sub-pixel electrode, the second sub-pixel electrode, the third sub-pixel electrode, and the fourth sub-pixel electrode may each include a first horizontal stem part and a second horizontal stem part that extend in a horizontal direction, and a plurality of minute branches that extend in a diagonal direction from both sides of each horizontal stem part.

A first vertical stem part which is perpendicular to the first horizontal stem part may be formed at one end of the first horizontal stem part of each of the first sub-pixel electrode, the second sub-pixel electrode, the third sub-pixel electrode, and the fourth sub-pixel electrode, a second vertical stem part which is perpendicular to the second horizontal stem part may be formed at one end of the second horizontal stem part, and the first vertical stem part and the second vertical stem part are formed at opposite sides of the horizontal stem part, respectively.

The second vertical stem part of the second sub-pixel electrode and the first vertical stem part of the third sub-pixel electrode may be disposed in the same direction.

The second vertical stem part of the third sub-pixel electrode and the first vertical stem part of the fourth sub-pixel electrode may be disposed in the same direction.

The second vertical stem part of the third sub-pixel electrode and the first vertical stem part of the fourth sub-pixel electrode may be disposed in directions which are opposite to each other.

A portion of the plurality of minute branches extending from the first horizontal stem part and a portion of the plurality of minute branches extending from the second horizontal stem part are connected to each other.

The plurality of minute branches may extend in a direction away from the first vertical stem part and the second vertical stem part.

Ends of the plurality of minute branches may be connected to each other.

All of the ends of the plurality of plurality of minute branches may be connected to each other.

The first pixel electrode and the second pixel electrode may have an interval greater than or equal to 2 and less than or equal to 10 nm.

The plurality of minute branches of the second sub-pixel electrode and the plurality of minute branches of the third sub-pixel electrode may be formed in a misaligned shape.

Another embodiment of the present inventive concept provides a liquid crystal display including: a first substrate; a first pixel electrode and a second pixel electrode formed on the first substrate and disposed to be adjacent to each other in a column direction; a second substrate corresponding to the first substrate; a common electrode on the second substrate; and a liquid crystal layer formed between the first substrate and the second substrate, wherein the first pixel electrode includes a first sub-pixel electrode and a second sub-pixel electrode that include a vertical stem part, a horizontal stem part, and a plurality of minute branches, the second pixel electrode includes a third sub-pixel electrode and a fourth sub-pixel electrode that include a vertical stem part, a horizontal stem part, and a plurality of minute branches, and the plurality of minute branches of the second sub-pixel electrode and the plurality of minute branches of the third sub-pixel electrode that are adjacent to each other in the column direction form an angle greater than or equal to 45° and less than or equal to 135°.

The first sub-pixel electrode, the second sub-pixel electrode, the third sub-pixel electrode, and the fourth sub-pixel electrode may each include a first horizontal stem part and a second horizontal stem part that extend in a horizontal direction, and a plurality of minute branches that extend in a diagonal direction from both sides of each horizontal stem part.

A first vertical stem part which is perpendicular to the first horizontal stem part may be formed at one end of the first horizontal stem part of each of the first sub-pixel electrode, the second sub-pixel electrode, the third sub-pixel electrode, and the fourth sub-pixel electrode, a second vertical stem part which is perpendicular to the second horizontal stem part may be formed at one end of the second horizontal stem part, and the first vertical stem part and the second vertical stem part are formed at opposite sides of the horizontal stem part, respectively.

The second vertical stem part of the second sub-pixel electrode and the first vertical stem part of the third sub-pixel electrode may be disposed in the same direction.

The second vertical stem part of the third sub-pixel electrode and the first vertical stem part of the fourth sub-pixel electrode may be disposed in the same direction.

The second vertical stem part of the third sub-pixel electrode and the first vertical stem part of the fourth sub-pixel electrode may be disposed in directions which are opposite to each other.

The plurality of plurality of minute branches may extend in a direction which grows away from the first vertical stem part and the second vertical stem part.

In addition to the above-mentioned objects, other features and advantages of the present inventive concept may be apparently understood by those skilled in the art to which the present inventive concept pertains from the following description.

According to an embodiment of the present inventive concept, there are the following effects.

The present inventive concept may improve transmittance, side visibility, and texture defect in the adjacent part of the first pixel electrode and the second pixel electrode by forming the angle formed by the plurality of minute branches of the first pixel electrode and the plurality of minute branches of the second pixel electrode which are adjacent to each other to be greater than or equal to 45° and less than or equal to 135°.

BRIEF DESCRIPTION OF THE DRAWINGS

FIG. 10 is a drawing comparing transmittance, visibility, and texture defect at the area in which two adjacent pixel electrodes are facing each other according to the comparative example and exemplary embodiment of the present inventive concept.

DETAILED DESCRIPTION OF THE EMBODIMENTS

Figure 1:
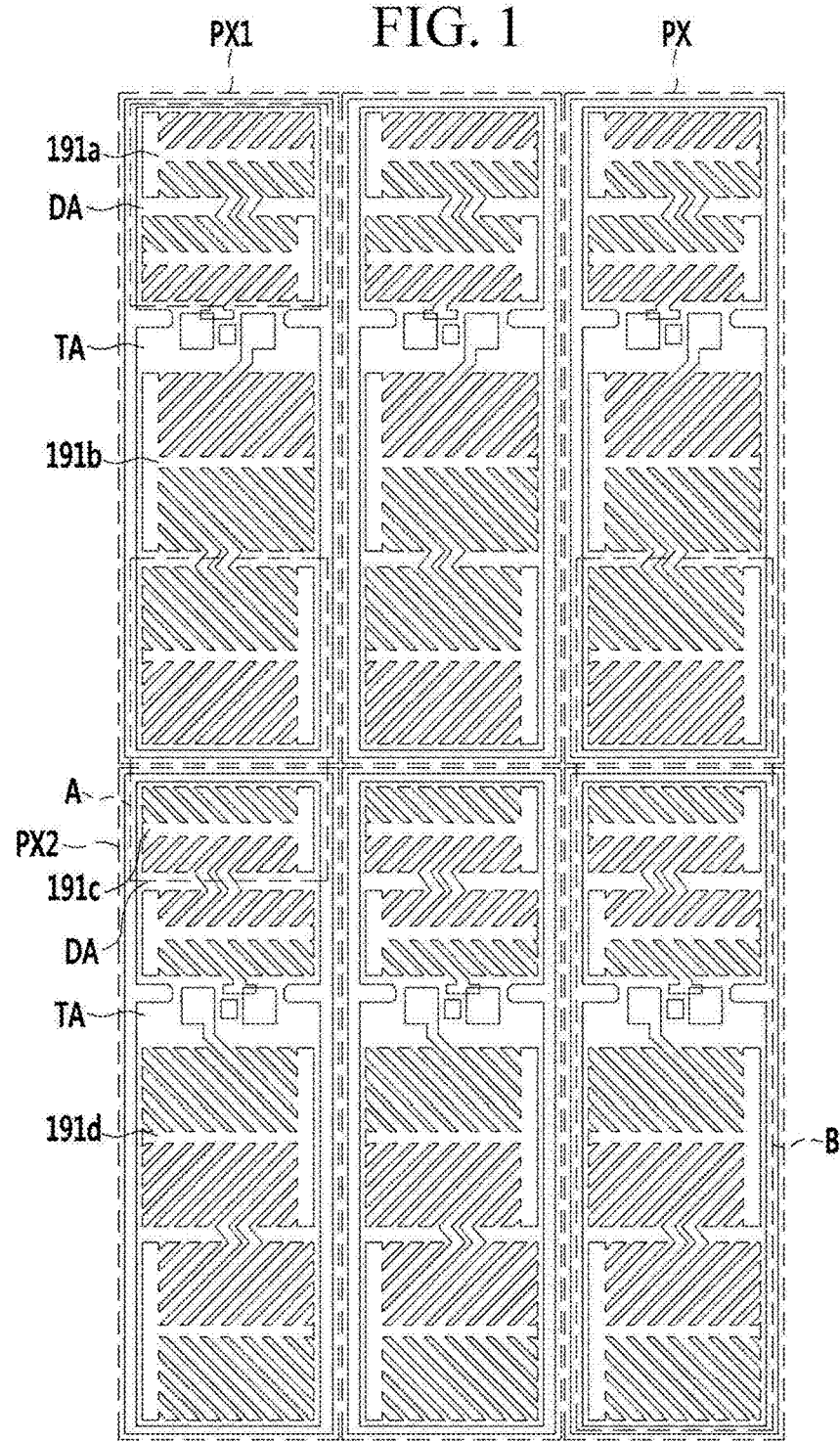
FIG. 1 is a schematic diagram of a thin film transistor display panel including a plurality of pixels according to an exemplary embodiment of the present inventive concept.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present between the element and the other element. In contrast, when an element is referred to as being "directly on" another element, there are no intervening elements present between the element and the other element.

Hereinafter, a thin film transistor display panel according to an exemplary embodiment of the present inventive concept will be described in detail with reference to the accompanying drawings.

The thin film transistor display panel according to an exemplary embodiment of the present inventive concept will be described with reference to FIGS. 1 to 3. FIG. 1 is a schematic diagram of a thin film transistor display panel including a plurality of pixels according to an exemplary embodiment of the present inventive concept.

First, referring to FIG. 1, the thin film transistor display panel according to an exemplary embodiment of the present inventive concept includes a plurality of pixels PXs.

The plurality of pixels PXs mainly include a thin film transistor forming area TA and a display area DA. The pixel electrodes are formed in the display area DA and an image is displayed through liquid crystal molecules disposed in the display area DA. Each of the plurality of pixels PXs may display any one of primary colors such as red, green, and blue.

The thin film transistor forming area TA has a thin film transistor element and a wiring, wherein the thin film transistor element and the wiring transfer a data voltage applied to the pixel electrodes of the display area DA.

A first pixel area PX1 and a second pixel area PX2 are disposed adjacent to each other in a column direction and each includes a first pixel electrode and a second pixel electrode.

The first pixel electrode has a first sub-pixel electrode 191a disposed above the thin film transistor forming area TA and a second sub-pixel electrode 191b disposed below the thin film transistor forming area TA.

In addition, the second pixel electrode has a third sub-pixel electrode 191c disposed above the thin film transistor forming area TA and a fourth sub-pixel electrode 191d disposed below the thin film transistor forming area TA.

Hereinafter, a detail structure of a pixel according to an exemplary embodiment of the present inventive concept will be described with reference to FIGS. 2 and 3.

Figure 2:
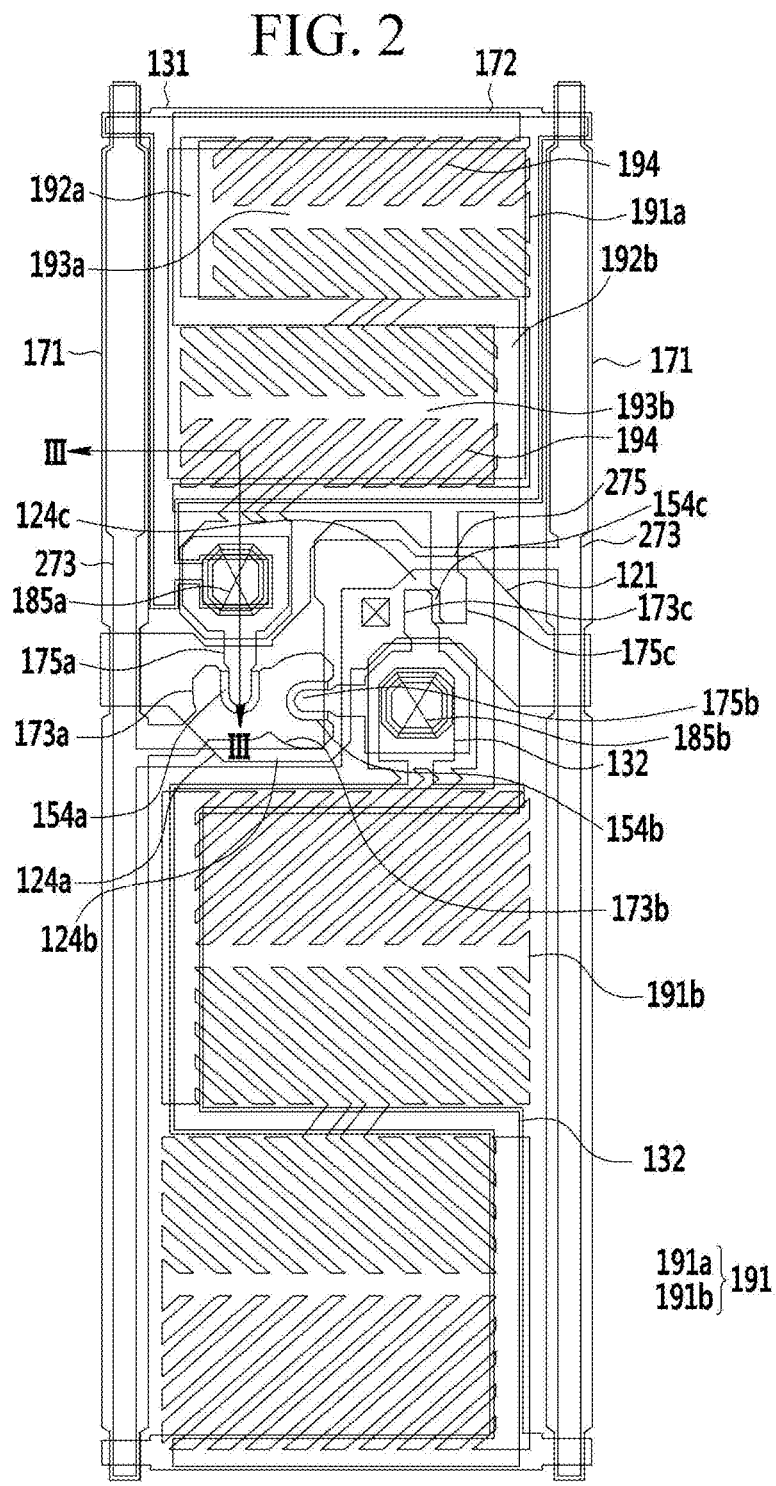
FIG. 2 is a layout view of a thin film transistor display panel according to an exemplary embodiment of the present inventive concept.
Figure 3:
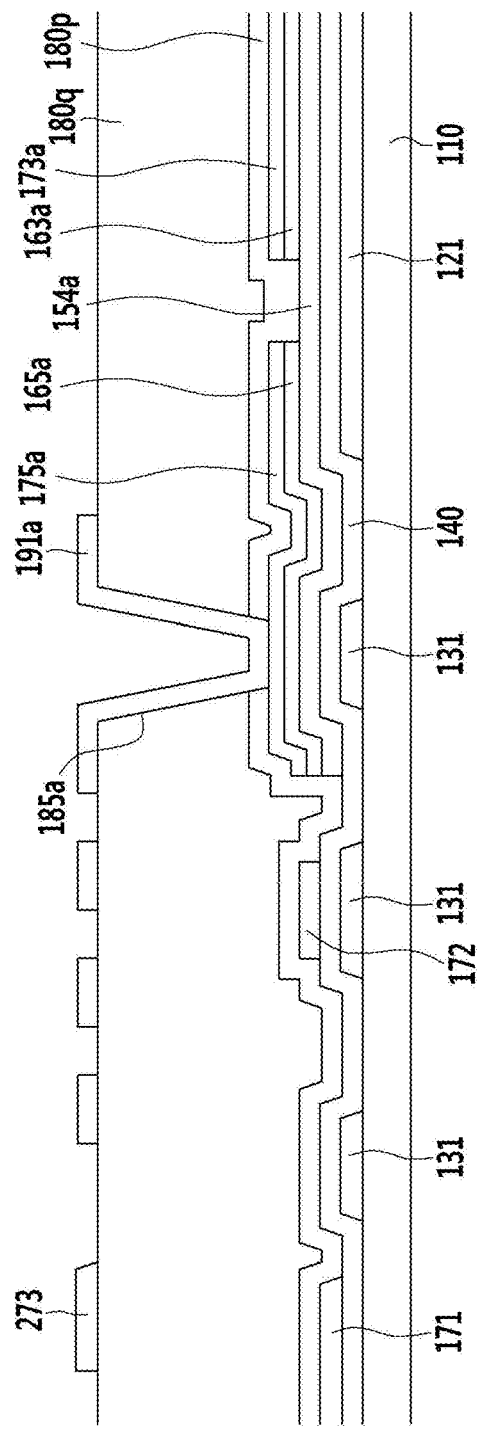
FIG. 3 is a cross-sectional view taken along line III-III for the thin film transistor display panel of FIG. 2.

FIG. 2 is a layout view of a thin film transistor display panel according to an exemplary embodiment of the present inventive concept and FIG. 3 is a cross-sectional view taken along line III-III for the thin film transistor display panel of FIG. 2.

A gate conductor including a gate line 121 and sustain electrode lines 131 and 132 is formed on a first substrate 110 made of transparent glass, plastic, or the like.

The gate line 121 includes gate electrodes and a pad portion (not shown) for allowing a connection with other layers or external driving circuits. The gate line 121 may be made of an aluminum (Al) based metal such as aluminum, an aluminum alloy, or the like, a silver (Ag) based metal such as silver, a silver alloy, or the like, a copper (Cu) based metal such as copper, a copper alloy, or the like, a molybdenum (Mo) based metal such as molybdenum, a molybdenum alloy, or the like, chromium (Cr), tantalum (Ta), titanium (Ti), and the like. However, the gate line 121 may have a multilayer structure including at least two conductive layers having different physical properties.

The gate line 121 traverses one pixel area in a horizontal direction. An area over the gate line 121 becomes the first sub-pixel area displaying high gray and an area below the gate line 121 becomes the second sub-pixel area displaying low gray.

The sustain electrode lines 131 and 132 may be made of the same material as that of the gate line 121 and may be formed by a simultaneous process with the gate line 121.

The sustain electrode line 131 over the gate line 121 may have a shape surrounding the first sub-pixel area in a quadrangular shape. A side disposed at the uppermost portion of the sustain electrode line 131 having the quadrangular shape may extend in the horizontal direction to an edge of the thin film transistor display panel so as to be connected to other layers or the external driving circuits.

The sustain electrode line 132 below the gate line 121 may be formed in the second sub-pixel area in a shape similar to a digital number of 5. That is, the sustain electrode line 132 includes a plurality of horizontal parts and a plurality of vertical parts that connect ends of the plurality of horizontal parts to each other. When a first horizontal part and a second horizontal part are connected at the left by a vertical part, the second horizontal part and a third horizontal part are connected at the right by another vertical part. The third horizontal part disposed at the lowermost end of the sustain electrode line 132 may extend in the horizontal direction to an edge of the thin film transistor display panel, so as to be connected to other layers or the external driving circuits. The third horizontal part of the sustain electrode line 132 is the same as an upper end horizontal part of the sustain electrode line 131 of another pixel area disposed therebelow. However, the shapes of the above-mentioned sustain electrode lines 131 and 132 may be variously modified and used.

A gate insulating layer 140 is formed on the gate conductor.

A first semiconductor 154a, a second semiconductor 154b, and a third semiconductor 154c are formed on the gate insulating layer 140.

A plurality of ohmic contacts 163a and 165a are formed on the semiconductors 154a, 154b, and 154c.

A data conductor including a data line 171 and a voltage dividing reference voltage line 172 is formed on the ohmic contacts 163a and 165a and the gate insulating layer 140. The data conductor, and the semiconductors and the ohmic contacts disposed below the data conductor may be simultaneously formed using one mask.

The data line 171 extends in the vertical direction along one pixel area and includes a first source electrode 173a and a second source electrode 173b.

In addition, the data conductor includes the voltage dividing reference voltage line 172, wherein the voltage dividing reference voltage line 172 includes a third drain electrode 175c.

The voltage dividing reference voltage line 172 includes a plurality of horizontal parts and vertical parts connecting the plurality of horizontal parts, and is formed in a shape similar to a digital number of 5. That is, the voltage dividing reference voltage line 172 includes the plurality of horizontal parts and the plurality of vertical parts that connect the plurality of horizontal parts to each other, wherein the vertical parts connect ends of the adjacent horizontal parts which are parallel to each other. That is, if a first horizontal part and a second horizontal part are connected at the left by a vertical part, a second horizontal part and a third horizontal part are connected at the right by another vertical part.

The voltage dividing reference voltage line 172 shows a shape similar to a digital number of 5 in each of the first sub-pixel area and the second sub-pixel area. In the case in which the second sub-pixel area has a length longer than that of the first sub-pixel area, a length of the voltage diving reference voltage line 172 of the second sub-pixel area is also increased.

However, the voltage diving reference voltage line 172 may be formed to have a shape in which the above-mentioned shape is reversed from side to side, depending on a direction of a pixel electrode to be formed later. That is, the voltage dividing reference voltage line 172 may have a shape similar to a digital number of 2, which is reversed from side to side, in the first sub-pixel area and the second sub-pixel area.

In the voltage dividing reference voltage line 172 disposed in the first sub-pixel area, a portion of the horizontal part which is disposed at the lowest portion extends downwardly to form the third drain electrode 175c.

The first gate electrode 124a, the first source electrode 173a, and the first drain electrode 175a form a single first thin film transistor (TFT) Qa together with the first island-type semiconductor 154a, and a channel of the thin film transistor is formed in the semiconductor 154a between the first source electrode 173a and the first drain electrode 175a. Similarly, the second gate electrode 124b, the second source electrode 173b, and the second drain electrode 175b form a single second thin film transistor Qb together with a second island-type semiconductor 154b, wherein a channel of the thin film transistor is formed in the semiconductor 154b between the second source electrode 173b and the second drain electrode 175b, and the third gate electrode 124c, the third source electrode 173c, and the third drain electrode 175c form a single third thin film transistor Qc together with a third land-type semiconductor 154c, wherein a channel of the thin film transistor is formed in the third semiconductor 154c between the third source electrode 173c and the third drain electrode 175c.

The second drain electrode 175b is connected to the third source electrode 173c and includes an expansion part which is widely expanded.

A passivation layer 180p is formed on the data conductor and portions of the exposed semiconductors 154a, 154b, and 154c. The first passivation layer 180p may include an inorganic insulating layer such as silicon nitride, silicon oxide, or the like. The first passivation layer 180p may prevent pigment of a color filter 230 from being introduced into the portions of the exposed semiconductor 154a, 154b, and 154c in the case in which a second passivation layer 180q is the color filer.

The second passivation layer 180q is disposed on the first passivation layer 180p. The second passivation layer 180q may be omitted. The second passivation layer 180q may be the color filer. In the case in which the second passivation layer 180q is the color filter, the second passivation layer 180q may uniquely display one of primary colors, wherein examples of the primary colors may include primary colors such as red, green, blue, yellow, cyan, magenta, and the like. Although not shown, the color filter may further include a color filter displaying a mixed color of the primary colors or white, in addition to the primary colors.

The first passivation layer 180p and the second passivation layer 180q have a first contact hole 185a and a second contact hole 185b formed therein so as to expose the first drain electrode 175a and the second drain electrode 175b.

A plurality of pixel electrodes 191 are formed on the second passivation layer 180q. The respective pixel electrodes 191 are separated from each other while having the gate line 121 therebetween, so as to include a first sub-pixel electrode 191a and a second sub-pixel electrode 191b which are adjacent to each other in a column direction with the gate line 121 interposed between them. The pixel electrode 191 may be made of a transparent material such as an ITO, an IZO, or the like. The pixel electrode 191 may also be made of a transparent conductive material such as an ITO, an IZO, or the like, or a reflective metal such as aluminum, silver, chromium, or an alloy thereof.

A shielding electrode 273 which is made of the same material as that of the pixel electrode 191 may be formed on the same layer as the pixel electrode 191 on the second passivation layer 180q. The pixel electrode 191 and the shielding electrode 273 may be simultaneously formed by the same process.

The shielding electrode 273 includes vertical parts overlapped with the data line of an edge of one pixel area and one or more horizontal parts 275 that connect the vertical parts which are adjacent to each other. The horizontal part 275 of the shielding electrode may have an expansion part at an intermediate thereof.

The shielding electrode 273 is applied with the same voltage as that of a common electrode (not shown). Therefore, an electric field does not occur between the shielding electrode 273 and the common electrode and the liquid crystal layer disposed between the shielding electrode 273 and the common electrode is not rearranged. Therefore, a liquid crystal between the shielding electrode and the common electrode may block light. In the case in which the liquid crystal blocks light as described above, the liquid crystal itself may perform a function of a black matrix. Therefore, in the liquid crystal display including the thin film transistor display panel according to an exemplary embodiment of the present inventive concept, the black matrix which is typically disposed on an upper display panel may be omitted. That is, the liquid crystal between the shielding electrode and the common electrode performs a function of the black matrix.

The pixel electrodes 191 are separated from each other while having the gate line 121 therebetween, so as to include a first sub-pixel electrode 191a and a second sub-pixel electrode 191b which are adjacent to each other in a column direction with the gate line 121 interposed between them.

The first sub-pixel electrode 191a includes horizontal stem parts that extend in a horizontal direction and a plurality of minute branches that extend in a diagonal direction from both sides of each horizontal stem part. In this case, two horizontal stem parts 193a and 193b and two vertical stem parts 192a and 192b are present in the first sub-pixel electrode 191a, wherein the plurality of minute branches 194 of the respective horizontal stem parts have different extension directions.

The first vertical stem part 192a which is perpendicular to the first horizontal stem part 193a is disposed at one end of the first horizontal stem part 193a, and the plurality of minute branches 194 that extend from the first horizontal stem part 193a obliquely extending in a direction away from the first vertical stem part 192a.

In addition, the second vertical stem part 192b which is perpendicular to the second horizontal stem part 193b is disposed at one end of the second horizontal stem part 193b, and the plurality of minute branches 194 that extend from the second horizontal stem part 193b obliquely extending in a direction away from the second vertical stem part 192b.

In this case, the first vertical stem part 192a and the second vertical stem part 192b are disposed on the other end of the first sub-pixel electrode. That is, if the first vertical stem part 192a is disposed at the left-hand end of the first horizontal stem part 193a, the second vertical stem part 192b is disposed at the right-hand end of the second horizontal stem part 193b. However, the above-mentioned directions are exemplary. For example, the first vertical stem part 192a may be disposed at the right-hand end of the first horizontal stem part 193a and the second vertical stem part 192b may be disposed at the left-hand end of the second horizontal stem part 193b.

The extending directions of the plurality of minute branches 194 that obliquely extend in the direction away from the first vertical stem part 192a and the plurality of minute branches 194 that obliquely extend in the direction away from the second vertical stem part 192b are different from each other.

A shape of the second sub-pixel electrode 191b is also the same as that of the first sub-pixel electrode 191a. That is, the second sub-pixel electrode 191b includes two horizontal stem parts 193a and 193b that extend in a horizontal direction, two vertical stem parts 192b and 192b, and a plurality of minute branches 194 that extend in a diagonal direction from both sides of each horizontal stem part.

In this case, the extending directions of the plurality of minute branches 194 that obliquely extend in the direction away from the first vertical stem part 192a of the second sub-pixel electrode 191b and the plurality of minute branches 194 that extend in the direction away from the second vertical stem part 192b of the second sub-pixel electrode 191b are different from each other. The configuration of the respective horizontal stem parts, the respective vertical stem parts, and the plurality of minute branches are the same as those described in the first sub-pixel electrode 191a. A detail description of the same contents will be omitted.

Hereinafter, a pixel electrode of a liquid crystal display according to various exemplary embodiments of the present inventive concept will be described with reference to FIGS. 4 to 6.

Figure 4:
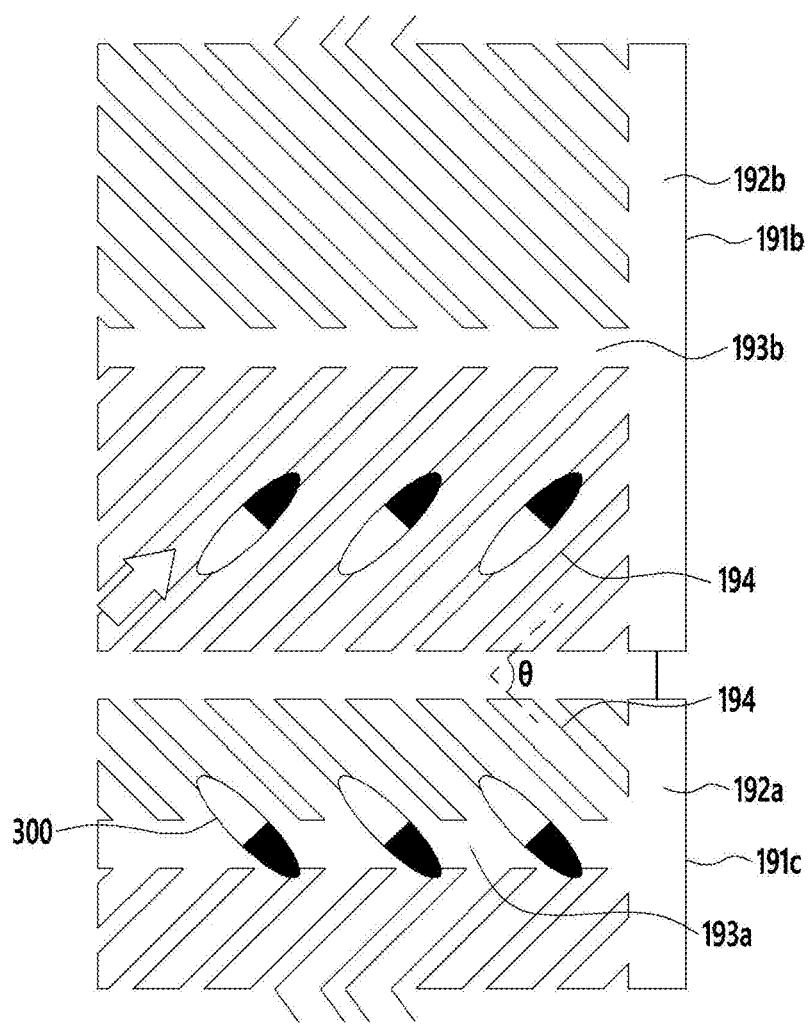
FIG. 4 is a drawing illustrating a pixel electrode of an area A of FIG. 1.
Figure 5A:
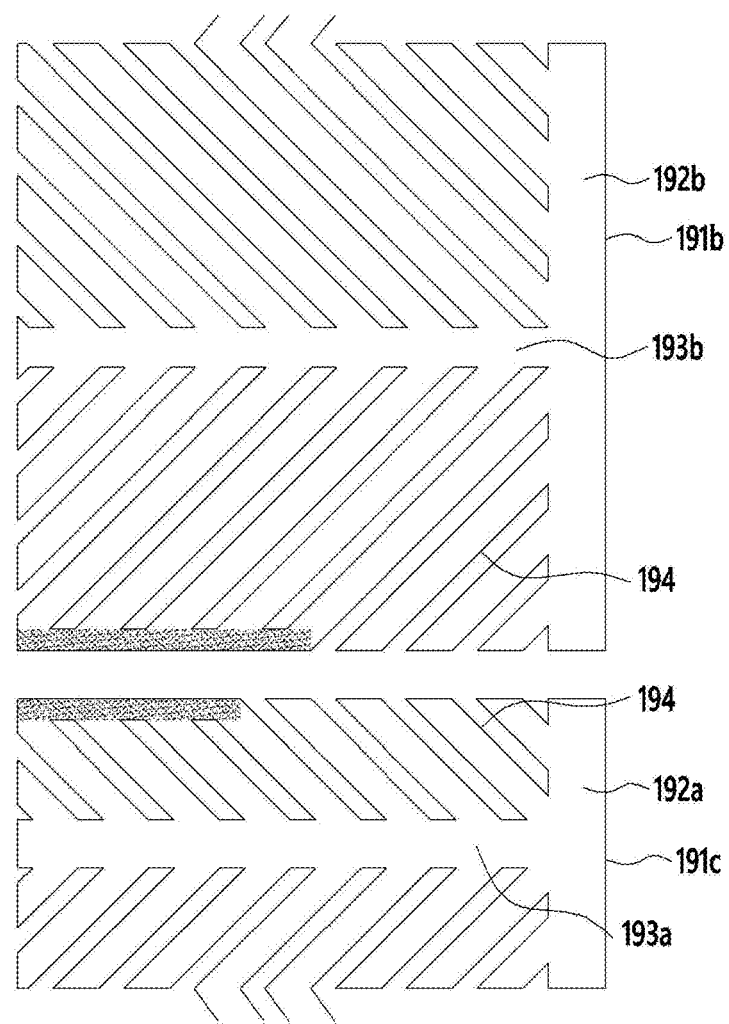
FIGS. 5A, 5B, 5C, 5D, 5E, 5F, 5G and 5H are drawings illustrating pixel electrodes of the area A of FIG. 1.
Figure 5B:
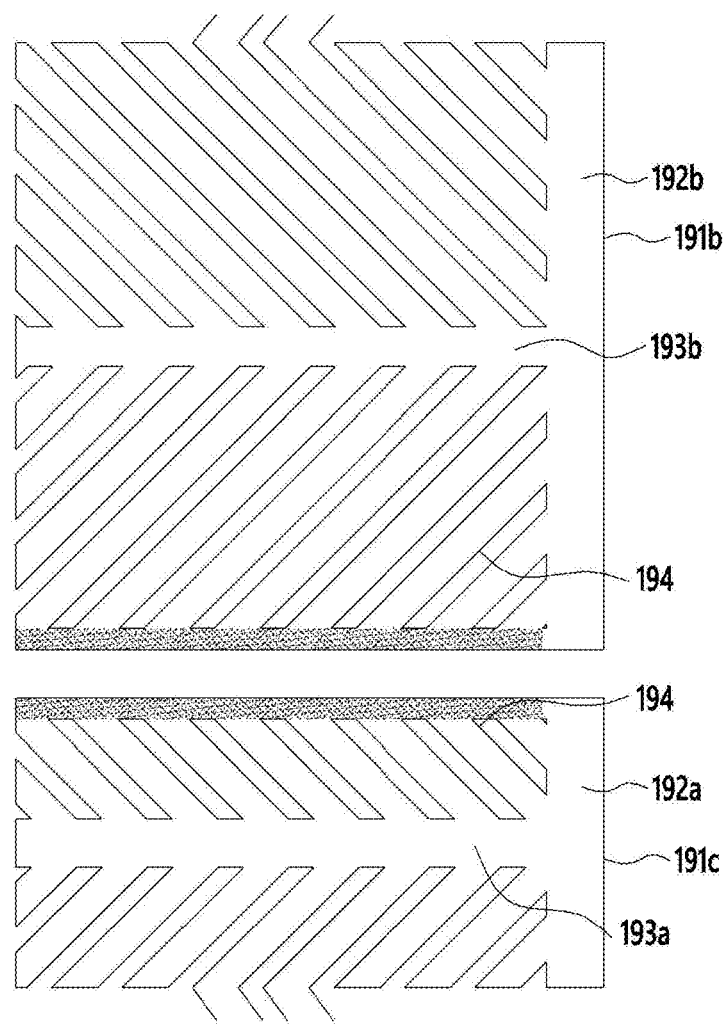
Figure 5C:
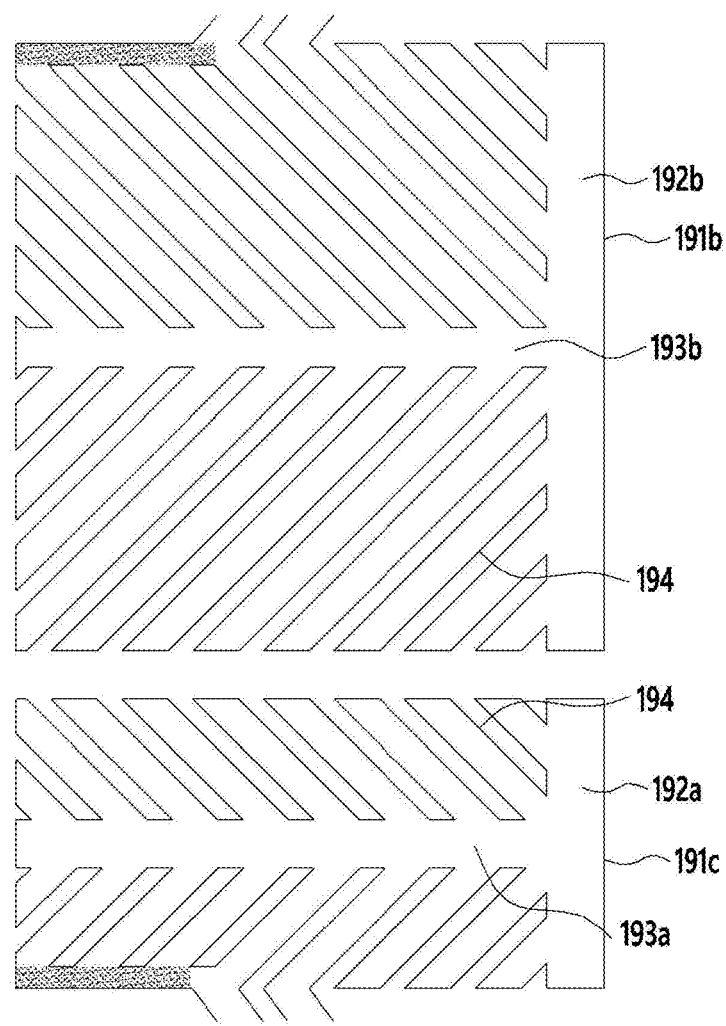
Figure 5D:
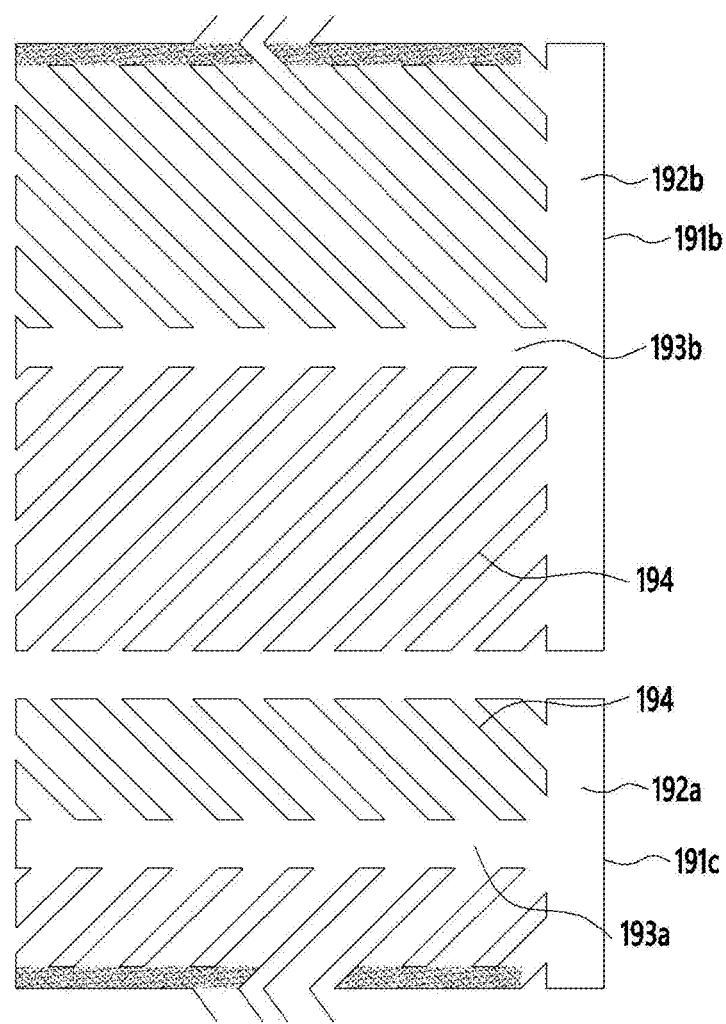
Figure 5E:
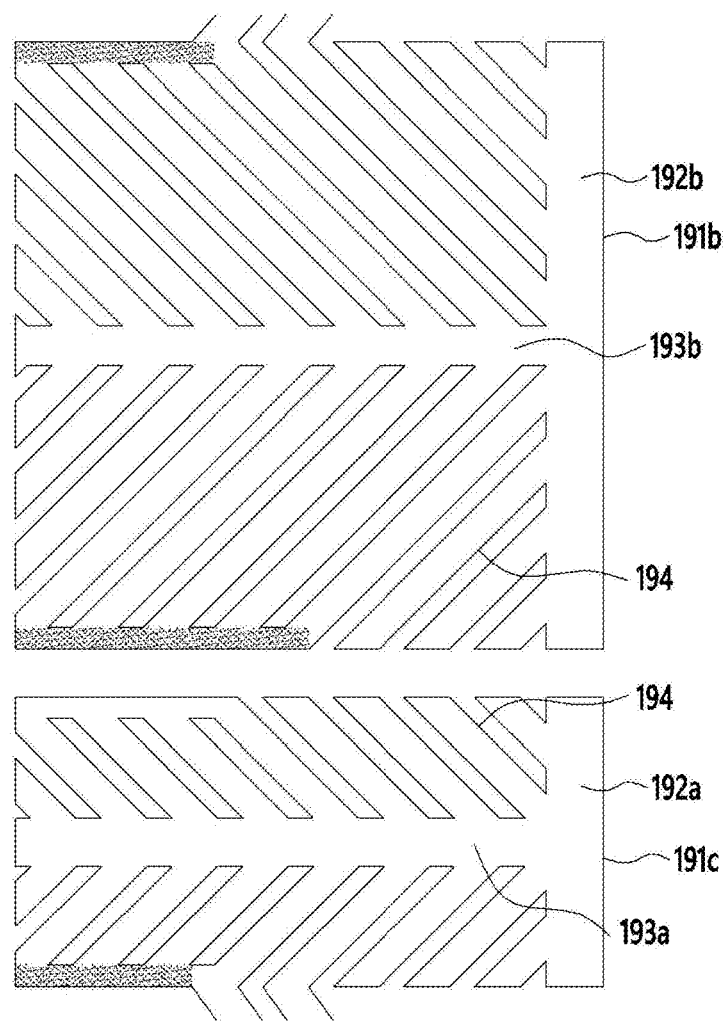
Figure 5F:
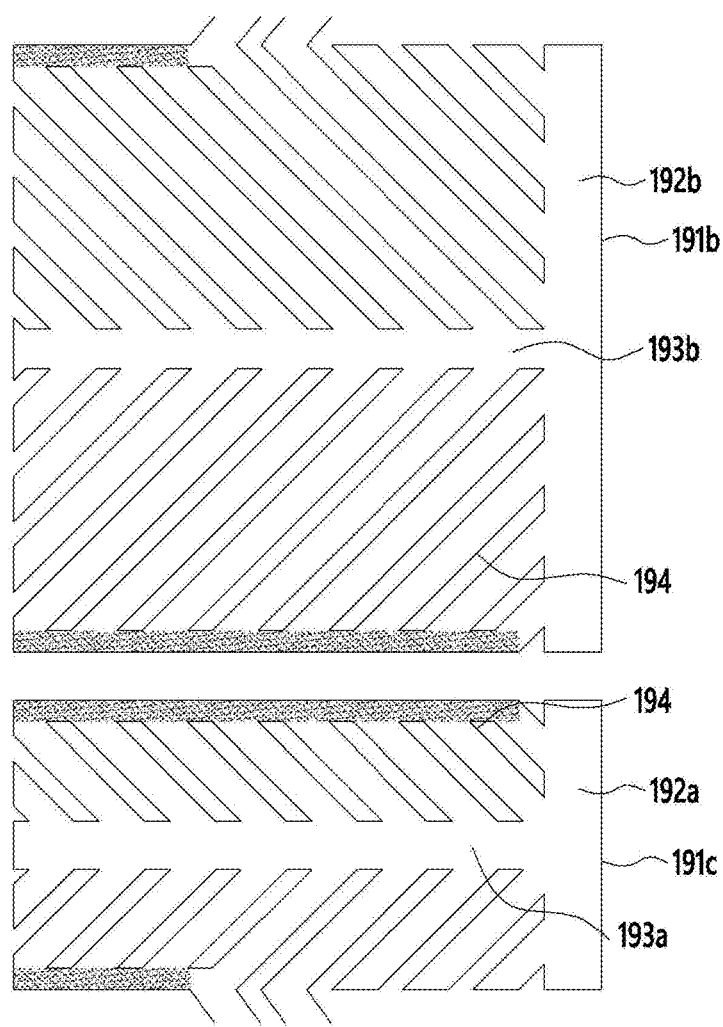
Figure 5G:
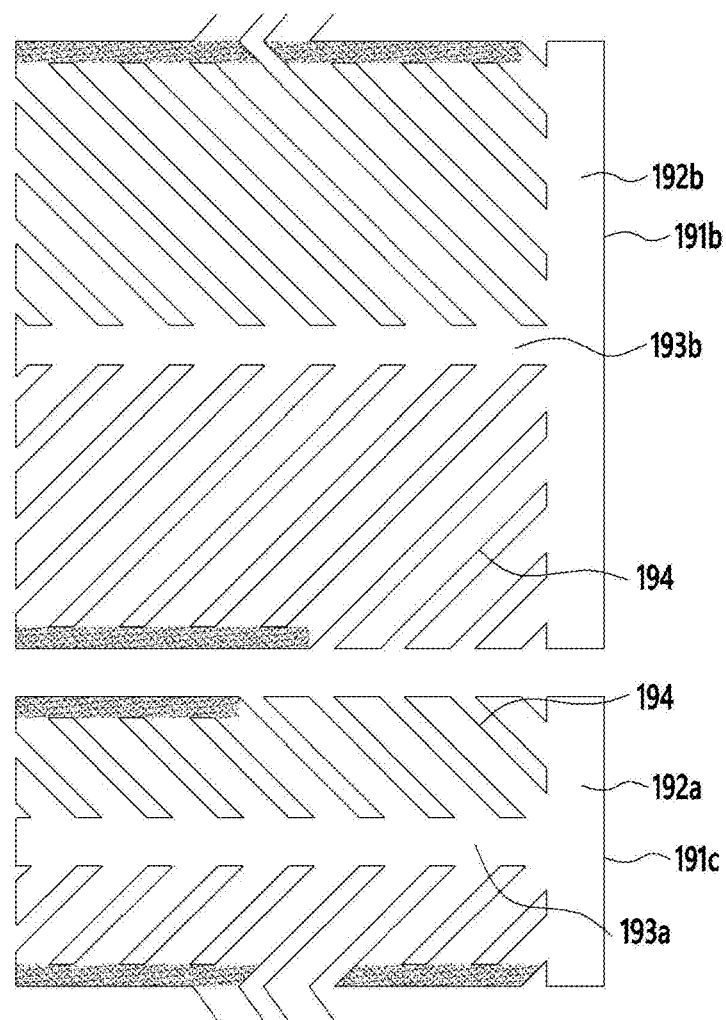
Figure 5H:
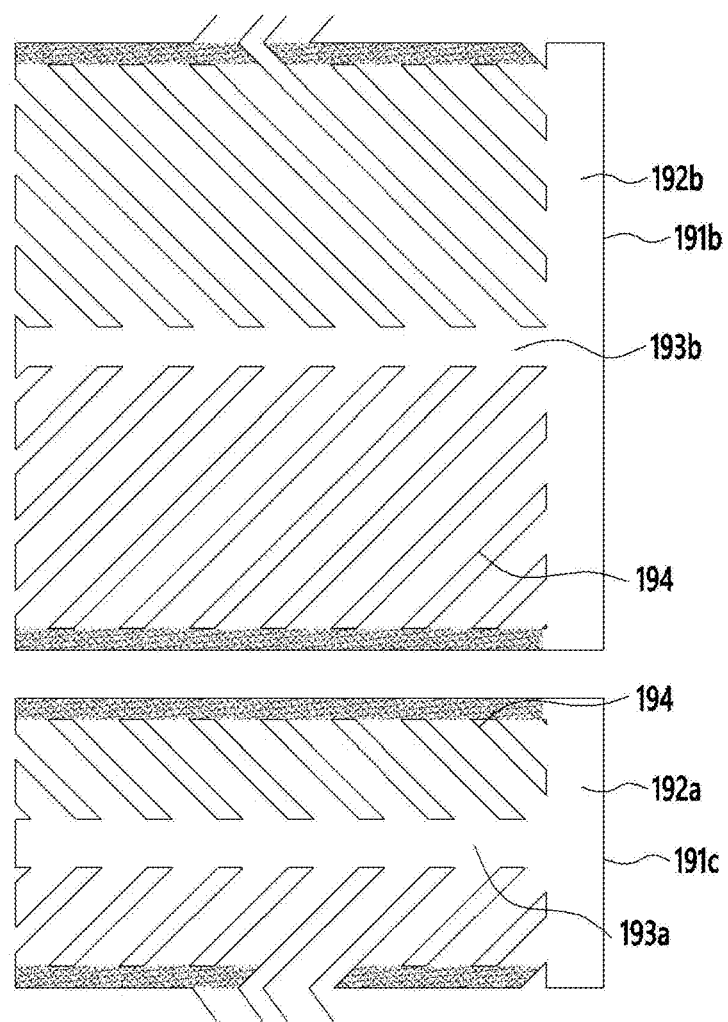

FIG. 4 is a drawing illustrating a pixel electrode of an area A of FIG. 1.

Referring to FIG. 4, a second sub-pixel electrode 191b of a first pixel electrode and a third sub-pixel electrode 191c of a second pixel electrode are disposed so as to be adjacent to each other in a column direction.

The second sub-pixel electrode 191b includes the second horizontal stem part 193b, the second vertical stem part 192b, and the plurality of minute branches 194 that obliquely extend in a direction away from the second horizontal stem part 193b and the second vertical stem part 192b.

The third sub-pixel electrode 191c includes the first horizontal stem part 193a, the first vertical stem part 192a, and the plurality of minute branches 194 that obliquely extend in a direction away from the first horizontal stem part 193a and the first vertical stem part 192a.

In this case, an angle θ which is formed by the plurality of minute branches 194 of the second sub-pixel electrode 191b and the plurality of minute branches 194 of the third sub-pixel electrode 191c which are adjacent to each other in the column direction is greater than or equal to 45° and less than or equal to 135°. The angle θ may be approximately 90°.

More specifically, the second vertical stem part 192b of the second sub-pixel electrode 191b and the first vertical stem part 192a of the third sub-pixel electrode 191c are disposed in the same direction, and the angle θ which is formed by the plurality of minute branches 194 extending in the direction away from the second vertical stem part 192b of the second sub-pixel electrode 191b and the plurality of minute branches 194 extending in the direction away from the first vertical stem part 192a of the third sub-pixel electrode 191c is formed to be greater than or equal to 45° and less than or equal to 135°. The angle θ may be approximately 90°.

That is, a horizontal component of a vector toward the second vertical stem part 192b along the plurality of minute branches 194 of the second sub-pixel electrode 191b in an adjacent part in which the second sub-pixel electrode 191b and the third sub-pixel electrode 191c are adjacent to each other, and a horizontal component of a vector toward the first vertical stem part 192a along the plurality of minute branches 194 of the third sub-pixel electrode 191c in the adjacent part have the same direction, a summation θ of angles formed by the respective vectors is formed to be greater than or equal to 45° and less than or equal to 135°.

FIGS. 5A to 5H are drawings illustrating pixel electrodes of the area A of FIG. 1, wherein the pixel electrodes illustrated in FIGS. 5A to 5H are the same as the pixel electrode illustrated in FIG. 4 described above, except for a structure in which ends of the plurality of minute branches are connected. Therefore, the same elements are denoted by the same reference numerals and a description thereof will be omitted.

Referring to FIGS. 5A to 5H, the ends of the plurality of minute branches 194 of the pixel electrode may be formed so that some or all thereof are connected. Portions in which the ends of the plurality of minute branches 194 of the pixel electrode are connected are indicated by dots.

The thin film transistor display panel according to an exemplary embodiment of the present inventive concept may minimize behaviors in a vertical direction of the liquid crystal disposed at the ends of the plurality of minute branches 194 by connecting some or all of the ends of the plurality of minute branches 194 of the pixel electrode, thereby making it possible to improve side visibility.

Figure 6:
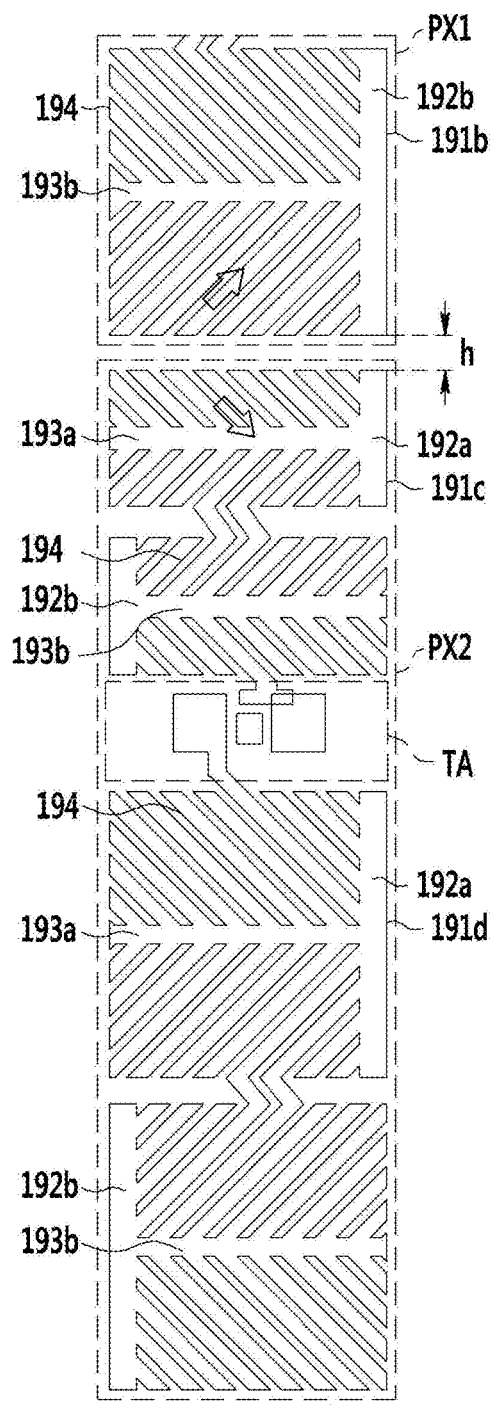
FIGS. 6 and 7 are drawings illustrating pixel electrodes of an area B of FIG. 1.
Figure 7:
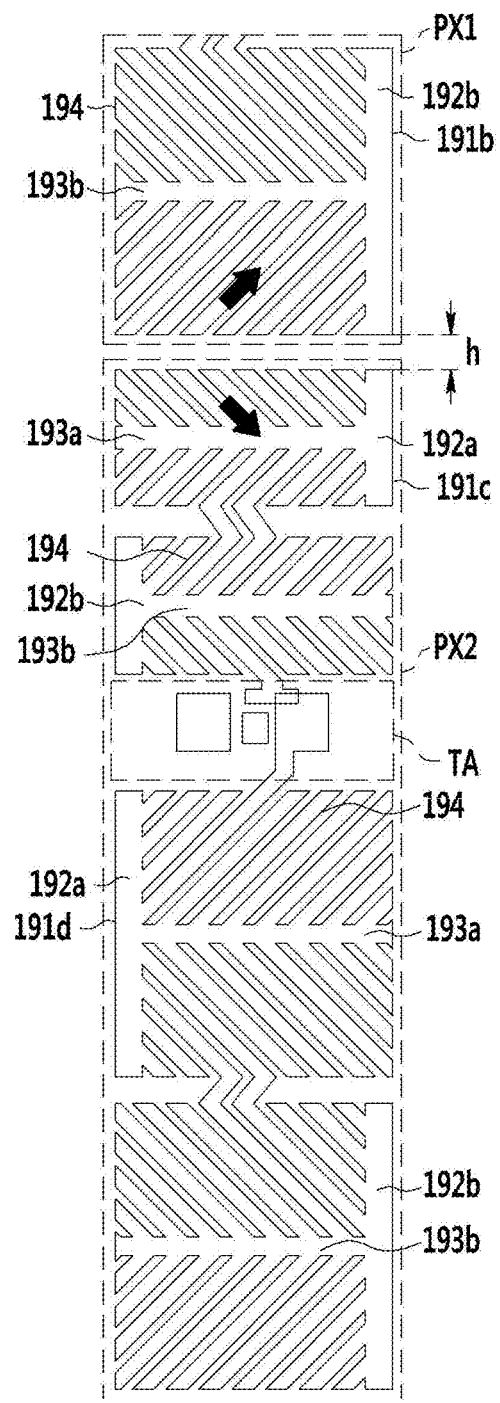

FIGS. 6 and 7 are drawings illustrating pixel electrodes of an area B of FIG. 1.

Referring to FIGS. 6 and 7, the thin film transistor display panel according to an exemplary embodiment of the present inventive concept includes a first pixel area PX1 and a second pixel area PX2 which are disposed to be adjacent to each other in a column direction.

The first pixel area PX1 includes the first pixel electrode and the second pixel area PX2 includes the second pixel electrode.

The first pixel electrode includes the first sub-pixel electrode 191a and the second sub-pixel electrode 191b, and the second pixel electrode includes the third sub-pixel electrode 191c and a fourth sub-pixel electrode 191d.

In this case, since the description of the second sub-pixel electrode 191b of the first pixel electrode and the third sub-pixel electrode 191c of the second pixel electrode has the same configuration as those described with reference to FIG. 4, an overlapped description will be omitted and only a difference will be described.

The plurality of minute branches 194 of the second sub-pixel electrode 191b and the plurality of minute branches 194 of the third sub-pixel electrode 191c may be formed in a misaligned shape, and an interval h between the second sub-pixel electrode 191b and the third sub-pixel electrode 191c may be more than or equal to 2 to less than or equal to 10 nm.

That is, The plurality of minute branches 194 of the second sub-pixel electrode 191b and the plurality of minute branches 194 of the third sub-pixel electrode 191c adjacent to each other does not exactly overlap each other, since they may be formed in a misaligned shape.

The second pixel electrode has the third sub-pixel electrode 191c disposed above the thin film transistor forming area TA and the fourth sub-pixel electrode 191d disposed below the thin film transistor forming area TA with the thin film transistor forming area TA interposed between them.

In this case, as illustrated in FIG. 6, the second vertical stem part 192b of the third sub-pixel electrode 191c and the first vertical stem part 192a of the fourth sub-pixel electrode 191d may be disposed in directions which are opposite to each other.

More specifically, the second vertical stem part 192b of the third sub-pixel electrode 191c may be disposed at the left-hand end of the second horizontal stem part 193b of the third sub-pixel electrode 191c, and the first vertical stem part 192a of the fourth sub-pixel electrode 191d may be disposed at the right-hand end of the first horizontal stem part 193a of the fourth sub-pixel electrode 191d. That is, the extending directions of the plurality of minute branches 194 that obliquely extend in the direction away from the second horizontal stem part 193b of the third sub-pixel electrode 191c and the plurality of minute branches 194 that extend the direction away from the first horizontal stem part 193a of the fourth sub-pixel electrode 191d are different from each other.

However, the above-mentioned directions are exemplary, and the second vertical stem part 192b of the third sub-pixel electrode 191c may be disposed at the right-hand end of the second horizontal stem part 193b of the third sub-pixel electrode 191c, and the first vertical stem part 192a of the fourth sub-pixel electrode 191d may be disposed at the left-hand end of the first horizontal stem part 193a of the fourth sub-pixel electrode 191d.

Unlike this, as illustrated in FIG. 7, the second vertical stem part 192b of the third sub-pixel electrode 191c and the first vertical stem part 192a of the fourth sub-pixel electrode 191d may be disposed in the same direction.

More specifically, the second vertical stem part 192b of the third sub-pixel electrode 191c may be disposed at the left-hand end of the second horizontal stem part 193b of the third sub-pixel electrode 191c, and the first vertical stem part 192a of the fourth sub-pixel electrode 191d may be disposed at the left-hand end of the first horizontal stem part 193a of the fourth sub-pixel electrode 191d. That is, the plurality of minute branches 194 that obliquely extend in the direction away from the second horizontal stem part 193b of the third sub-pixel electrode 191c and the plurality of minute branches 194 that extend in the direction away from the first horizontal stem part 193a of the fourth sub-pixel electrode 191d may extend in the same direction.

However, the above-mentioned directions are exemplary, and the second vertical stem part 192b of the third sub-pixel electrode 191c may be disposed at the right-hand end of the second horizontal stem part 193b of the third sub-pixel electrode 191c, and the first vertical stem part 192a of the fourth sub-pixel electrode 191d may be disposed at the right-hand end of the first horizontal stem part 193a of the fourth sub-pixel electrode 191d.

Hereinafter, a liquid crystal display according to a comparative example of the present inventive concept will be described with reference to FIG. 8.

Figure 8:
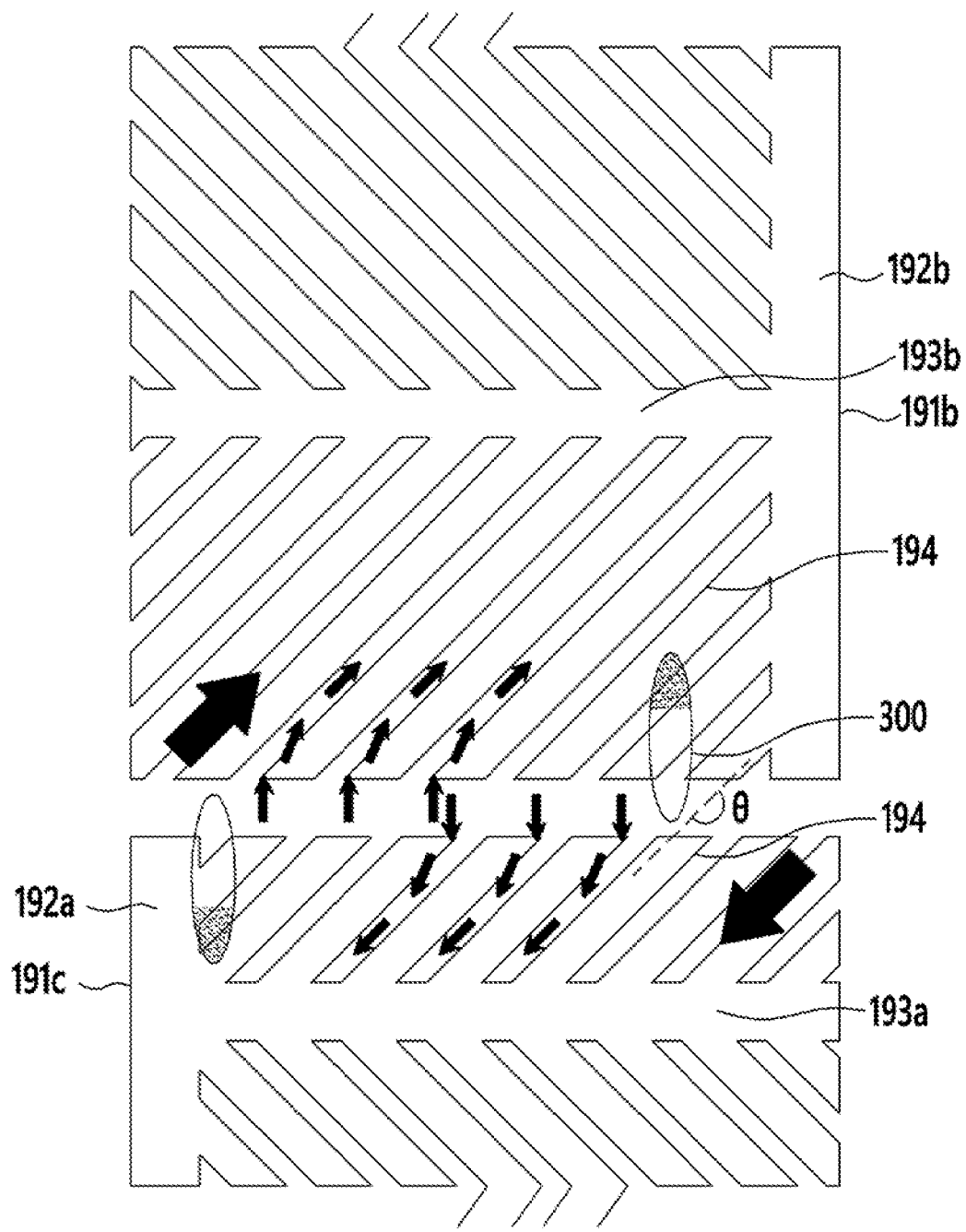
FIG. 8 is a drawing illustrating a pixel electrode of a liquid crystal display according to a comparative example of the present inventive concept.

FIG. 8 shows a pixel electrode of a liquid crystal display according the comparative example of the present inventive concept, wherein the description will be provided in comparison with the pixel electrode according to an exemplary embodiment of the present inventive concept of FIG. 4. In comparison with FIG. 4, the same elements are denoted by the same reference numerals and a description thereof will be omitted.

Referring to FIG. 8, the pixel electrode of the liquid crystal display according to the comparative example of the present inventive concept includes a first pixel electrode and a second pixel electrode, wherein a second sub-pixel electrode 191b of the first pixel electrode and a third sub-pixel electrode 191c of the second pixel electrode are disposed to be adjacent to each other in a column direction.

The second sub-pixel electrode 191b includes the second horizontal stem part 193b, the second vertical stem part 192b, and the plurality of minute branches 194 that obliquely extend in a direction away from the second horizontal stem part 193b and the second vertical stem part 192b.

The third sub-pixel electrode 191c includes the first horizontal stem part 193a, the first vertical stem part 192a, and the plurality of minute branches 194 that obliquely extend in a direction away from the first horizontal stem part 193a and the first vertical stem part 192a.

In this case, an angle θ which is formed by the plurality of minute branches 194 of the second sub-pixel electrode 191b and the plurality of minute branches 194 of the third sub-pixel electrode 191c which are adjacent to each other in the column direction is approximately 180°.

More specifically, the second vertical stem part 192b of the second sub-pixel electrode 191b and the first vertical stem part 192a of the third sub-pixel electrode 191c are disposed in directions which are opposite to each other, and the angle θ which is formed by the plurality of minute branches 194 extending in the direction away from the second vertical stem part 192b of the second sub-pixel electrode 191b and the plurality of minute branches 194 extending in the direction away from the first vertical stem part 192a of the third sub-pixel electrode 191c is formed to be 180°.

That is, a horizontal component of a vector toward the second vertical stem part 192b along the plurality of minute branches 194 of the second sub-pixel electrode 191b in an adjacent part in which the second sub-pixel electrode 191b and the third sub-pixel electrode 191c are adjacent to each other, and a horizontal component of a vector toward the first vertical stem part 192a along the plurality of minute branches 194 of the third sub-pixel electrode 191c in the adjacent part have directions which are opposite to each other.

In the pixel structure according to the comparative example of the present inventive concept, a backward electric filed may be generated by the second sub-pixel electrode 191b and the third sub-pixel electrode 191c which are adjacent to each other in the column direction, a liquid crystal molecule 300 in the adjacent part in which the second sub-pixel electrode 191b and the third sub-pixel electrode 191c are adjacent to each other may be arranged in a vertical direction, thereby deteriorating visibility in left and right directions, and texture may occur in the adjacent part.

Referring to again FIG. 4, since the angle θ which is formed by the plurality of minute branches 194 of the second sub-pixel electrode 191b and the plurality of minute branches 194 of the third sub-pixel electrode 191c which are disposed to be adjacent to each other in the column direction is greater than or equal to 45° and less than or equal to 135°, the arrangement of the liquid crystal molecule 300 in the vertical direction may be minimized in the adjacent part of the first pixel electrode and the second pixel electrode, thereby making it possible to improve transmittance, visibility in left and right directions, and texture defect.

Figure 9:
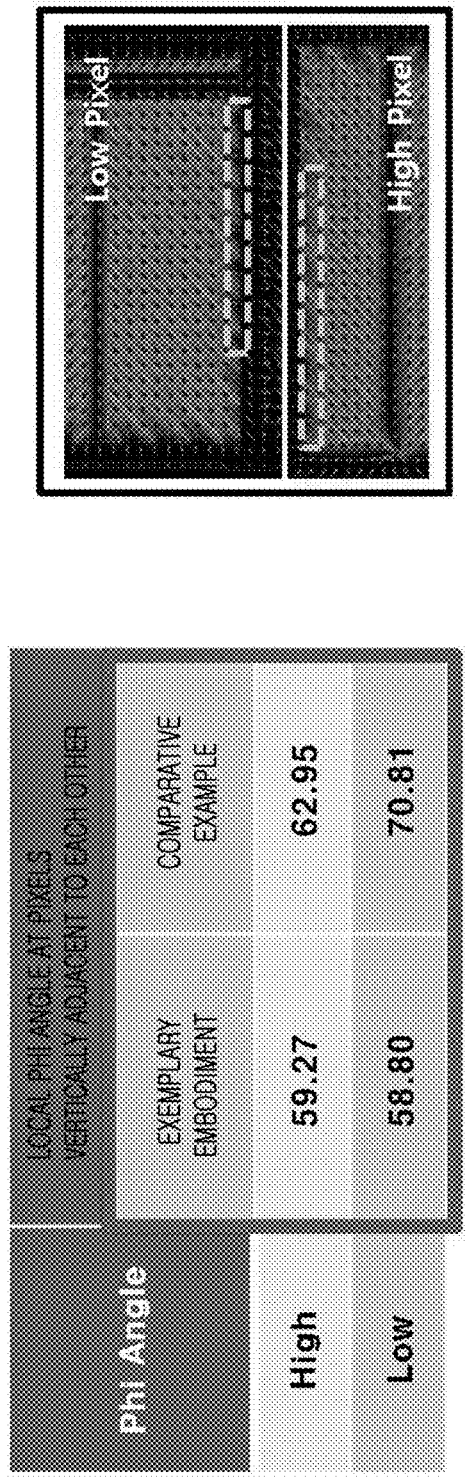
FIG. 9 is a simulation drawing illustrating local phi angles of a liquid crystal molecule at an area in which two adjacent pixel electrodes are facing each other according to the comparative example and exemplary embodiment of the present inventive concept.

FIG. 9 is a simulation drawing illustrating local phi angles of a liquid crystal molecule at an area in which two adjacent pixel electrodes are facing each other according to the comparative example and exemplary embodiment of the present inventive concept and FIG. 10 is a drawing comparing transmittance, visibility, and texture defect at the area in which two adjacent pixel electrodes are facing each other according to the comparative example and exemplary embodiment of the present inventive concept.

First, referring to FIG. 9, the local phi angles of a liquid crystal molecule at the adjacent part of the pixel electrodes according to the comparative example and exemplary embodiment of the present inventive concept may be confirmed. Here, the local phi angle of the liquid crystal molecule refers to an angle formed by the liquid crystal molecule and the adjacent part (an X axis in a horizontal direction) of the pixel electrodes.

It may be appreciated that an exemplary embodiment of the present inventive concept has the local phi angle of the liquid crystal molecule at the adjacent part of the second sub-pixel electrode 191b (low pixel) and the third sub-pixel electrode 191b (high pixel), which is smaller than that in the comparative example of the present inventive concept. That is, it may be appreciated that an exemplary embodiment of the present inventive concept may minimize the arrangement of the liquid crystal molecule in the vertical direction at the adjacent part of the pixel electrodes which are disposed to be adjacent in the column direction, rather than Comparative Example of the present inventive concept.

Referring to FIG. 10, it may be confirmed that an exemplary embodiment of the present inventive concept improves transmittance and side visibility at the adjacent part of the second sub-pixel electrode 191b of the first pixel electrode and the third sub-pixel electrode 191c of the second pixel electrode and decreases texture defect, rather than the comparative example of the present inventive concept.

Figure 11:
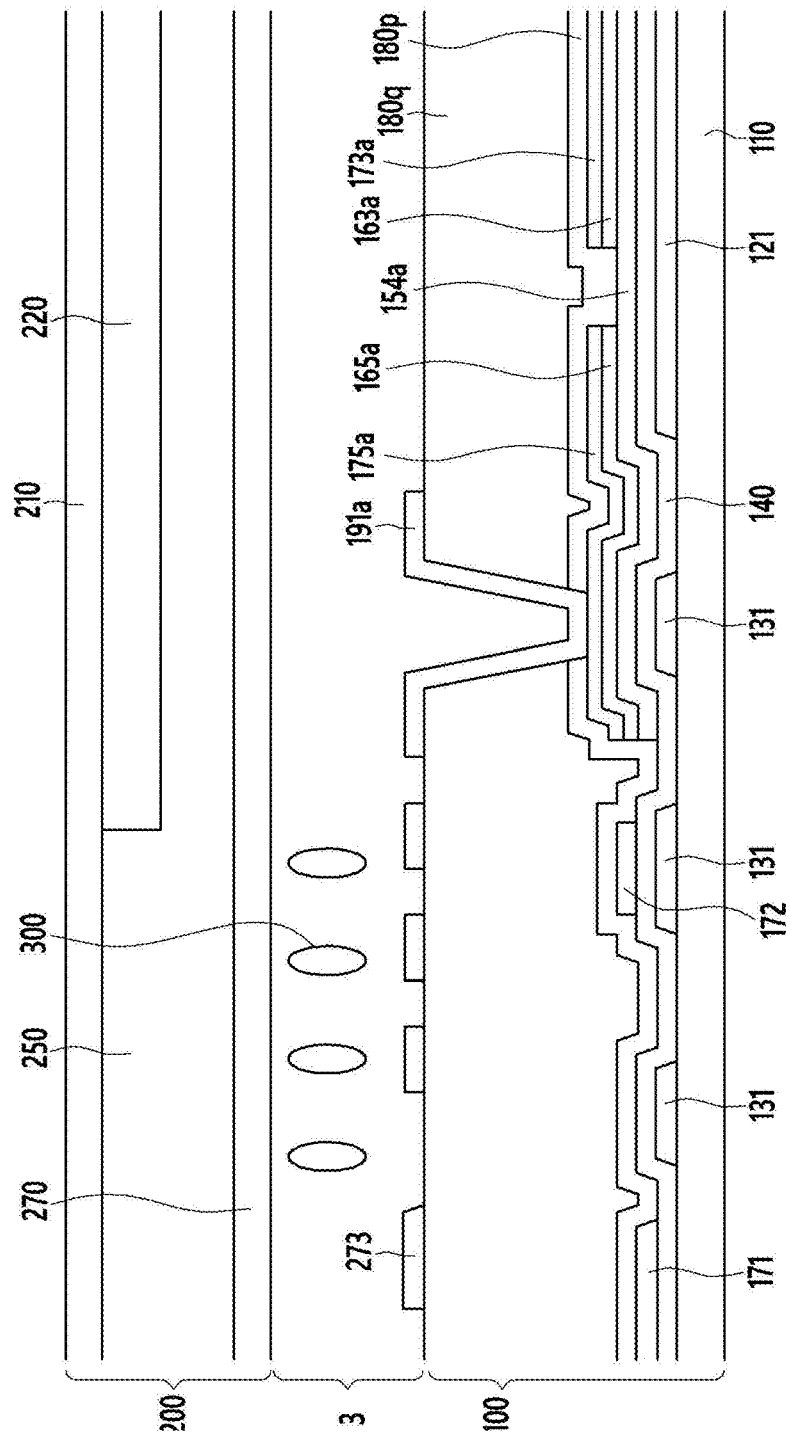
FIG. 11 is a cross-sectional view of a liquid crystal display according to an exemplary embodiment of the present inventive concept.

Hereinafter, a liquid crystal display including a thin film transistor display panel according to the present inventive concept will be described with reference to FIG. 11. FIG. 11 is a cross-sectional view of a liquid crystal display according to an exemplary embodiment of the present inventive concept.

Referring to FIG. 11, a lower display panel 100 of the liquid crystal display according to an exemplary embodiment of the present inventive concept has the same contents as those of the thin film transistor display panel as described above. A detail description of the same elements will be omitted.

Next, an upper display panel 200 will be described.

A light blocking member 220 is formed on the second substrate 210 which is made of transparent glass, plastic, or the like. The light blocking member 220 may also be called a black matrix and may prevent light leakage.

A plurality of color filters (not shown) are also formed on the second substrate 210. In the case in which the second passivation layer 180q of the lower display panel 100 is the color filter, the color filter of the upper display panel 200 may be omitted. In addition, the light blocking member 220 of the upper display panel 200 may also be formed on the lower display panel 100.

An overcoat 250 is formed on the color filter and the light blocking member 220. The overcoat 250 may be made of an (organic) insulating material, prevent the color filter from being exposed, and provide a flat surface. The overcoat 250 may be omitted.

The liquid crystal layer 3 has negative dielectric anisotropy, and liquid crystal molecules 300 of the liquid crystal layer 3 are aligned so that major axes thereof are perpendicular to surfaces of the two display panels 100 and 200 in a state in which an electric field is not present.

The first sub-pixel electrode 191a and the second sub-pixel electrode 191b to which a data voltage is applied generate an electrical field together with the common electrode 270 of the upper display panel 200 to thereby determine a direction of the liquid crystal molecule 300 of the liquid crystal layer 3 between the two electrodes 191 and 270. Luminance of light passing through the liquid crystal layer 3 is changed depending on the direction of the liquid crystal molecule 200 determined as described above.

Hereinafter, an arrangement of a signal line and a pixel of a liquid crystal display according to the exemplary embodiment of the present inventive concept and a driving method thereof will be described in various ways.

FIGS. 12 to 16 are equivalent circuit diagrams of a pixel of the liquid crystal display according to an exemplary embodiment of the present inventive concept.

First, an exemplary embodiment of FIG. 12 will be described.

Figure 12:
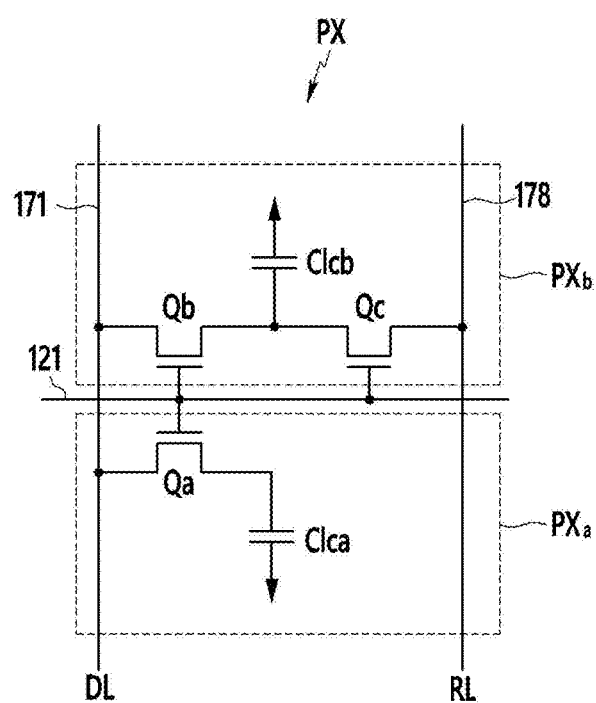
FIGS. 12, 13, 14, 15 and 16 are equivalent circuit diagrams of a pixel of the liquid crystal display according to an exemplary embodiment of the present inventive concept.

Referring to FIG. 12, the liquid crystal display according to an exemplary embodiment of the present inventive concept includes signal lines such as a gate line 121, a data line 171, a reference voltage line 178 transferring a reference voltage, and the like, and pixels PXs connected to the signal lines.

Each pixel PX may include first and second sub-pixels PXa and PXb. The first sub-pixel PXa includes a first switching element Qa and a first liquid crystal capacitor Clca, and the second sub-pixel PXb includes second and third switching elements Qb and Qc, and a second liquid crystal capacitor Clcb. The first switching element Qa and the second switching element Qb are each connected to the gate line 121 and the data line 171, and the third switching element Qc is connected to an output terminal of the second switching element Qb and the reference voltage line 178. An output terminal of the first switching element Qa is connected to the first liquid crystal capacitor Clca, and an output terminal of the second switching element Qb is connected to the second liquid crystal capacitor Clcb and an input terminal of the third switching element Qc. A control terminal of the third switching element Qc is connected to the gate line 121, an input terminal thereof is connected to the second liquid crystal capacitor Clcb, and an output terminal thereof is connected to the reference voltage line 178.

An operation of the pixel PX shown in FIG. 12 will be described. First, when a gate ON voltage Von is applied to the gate line 121, the first switching element Qa, the second switching element Qb, and the third switching element Qc which are connected to the gate line 121 are turned on. Therefore, the data voltage applied to the data line 171 is applied to the first liquid crystal capacitor Clca and the second liquid crystal capacitor Clcb, respectively, through the first switching element Qa and the second switching element Qb which are turned on, such that the first liquid crystal capacitor Clca and the second liquid crystal capacitor Clcb are charged with a difference between the data voltage and a common voltage Vcom. In this case, the first liquid crystal capacitor Clca and the second liquid crystal capacitor Clcb are applied with the same data voltage through the first and second switching elements Qa and Qb, but the charged voltage of the second liquid crystal capacitor Clcb is divided by the third switching element Qc. Therefore, since the charged voltage of the second liquid crystal capacitor Clcb becomes smaller than the charged voltage of the first liquid crystal capacitor Clca, luminances of the two sub-pixels PXa and PXb may be different. Therefore, in the case in which the voltage charged in the first liquid crystal capacitor Clca and the voltage charged in the second liquid crystal capacitor Clcb are appropriately adjusted, it is possible to maximally match an image viewed from the side to an image viewed from the front, thereby improving side visibility.

Figure 13:
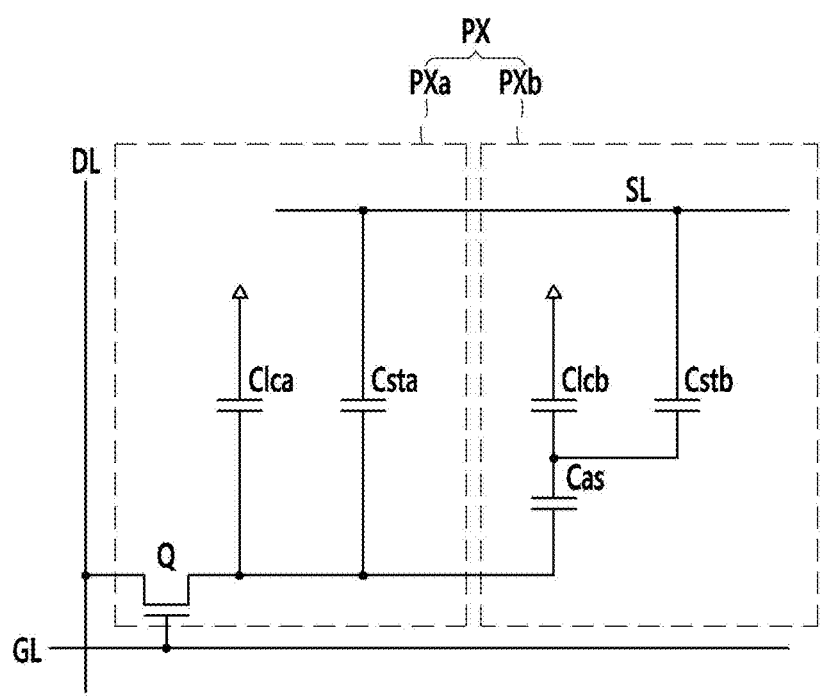

Hereinafter, an exemplary embodiment of FIG. 13 will be described.

The liquid crystal display according to an exemplary embodiment of the present inventive concept includes a signal line including a plurality of gate lines GL, a plurality of data lines DL, and a plurality of sustain electrode lines SL, and a plurality of pixels PXs connected to the signal line. Each pixel PX includes a pair of first and second sub-pixels PXa and PXb, wherein the first sub-pixel PXa is formed with the first sub-pixel electrode and the second sub-pixel PXb is formed with the second sub-pixel electrode.

The liquid crystal display according to an exemplary embodiment of the present inventive concept further includes a switching element Q connected to the gate line GL and the data line DL, a first liquid crystal capacitor Clca and a first sustain capacitor Csta which are formed in the first sub-pixel PXa connected to the switching element Q, a second liquid crystal capacitor Clcb and a second sustain capacitor Cstb which are formed in the second sub-pixel PXb connected to the switching element Q, and an auxiliary capacitor Cas formed between the switching element Q and the second liquid crystal capacitor Clcb.

The switching element Q, which is a three-terminal element of the thin film transistor or the like provided in the lower display panel 100, has a control terminal connected to the gate line GL, an input terminal connected to the data line DL, and an output terminal connected to the first liquid crystal capacitor Clca, the first sustain capacitor Csta, and the auxiliary capacitor Cas.

One side terminal of the auxiliary capacitor Cas is connected to the output terminal of the switching element Q and the other side terminal thereof is connected to the second liquid crystal capacitor Clcb and the second sustain capacitor Cstb.

A charged voltage of the second liquid crystal capacitor Clcb is decreased to be lower than a charged voltage of the first liquid crystal capacitor Clca by the auxiliary capacitor Cas, such that side visibility of the liquid crystal display may be improved.

Figure 14:
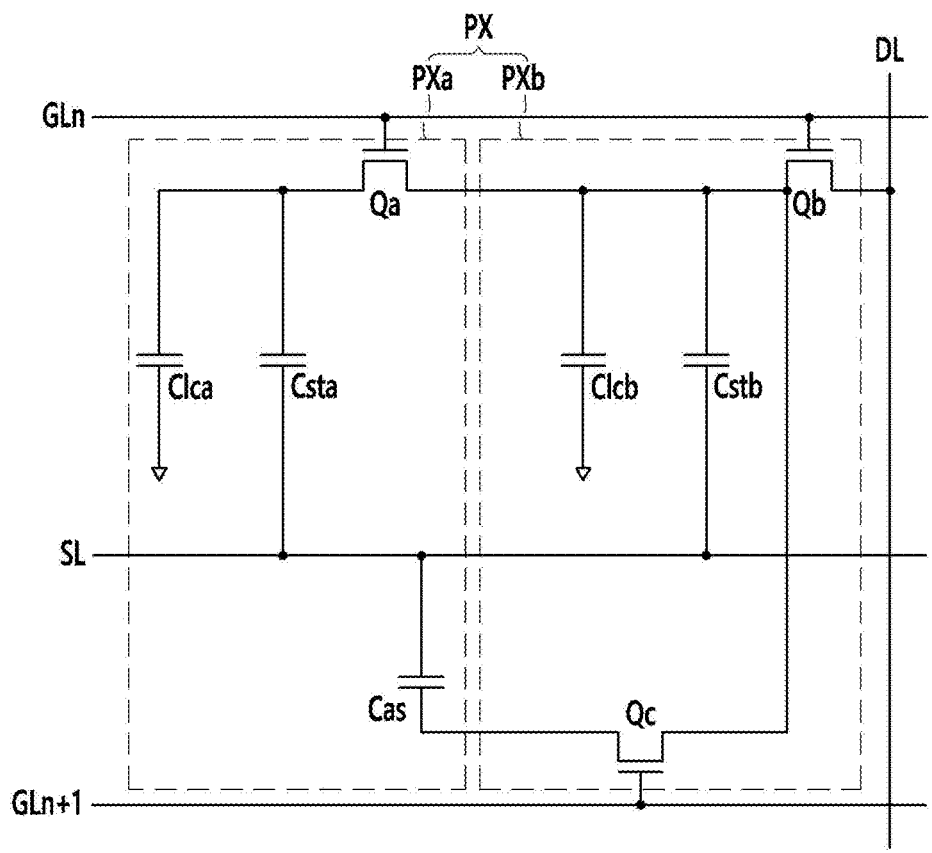

Hereinafter, an exemplary embodiment of FIG. 14 will be described.

The liquid crystal display according to an exemplary embodiment of the present inventive concept includes a signal line including a plurality of gate lines GLn and GLn+1, a plurality of data lines DL, and a plurality of sustain electrode lines SL, and a plurality of pixels PXs connected to the signal line. Each pixel PX includes a pair of first and second sub-pixels PXa and PXb, wherein the first sub-pixel PXa is formed with the first sub-pixel electrode and the second sub-pixel PXb is formed with the second sub-pixel electrode.

The liquid crystal display according to an exemplary embodiment of the present inventive concept further includes a first switching element Qa and a second switching element Qb which are connected to the gate line GLn and the data line DL, a first liquid crystal capacitor Clca and a first sustain capacitor Csta connected to the first switching element Qa and formed in the first sub-pixel PXa, a second liquid crystal capacitor Clcb and a second sustain capacitor Cstb connected to the second switching element Qb and formed in the second sub-pixel PXb, a third switching element Qc connected to the second switching element Qb and switched by the gate line GLn+1 of a next stage, and an auxiliary capacitor Cas connected to the third switching element Qc.

The first switching element Qa and the second switching element Qb, which are the three-terminal element of the thin film transistor or the like provided in the lower display panel 100, has a control terminal connected to the gate line GLn, an input terminal connected to the data line DL, and an output terminal connected to the first liquid crystal capacitor Clca and the first sustain capacitor Csta, respectively, and the second liquid crystal capacitor Clcb and the second sustain capacitor Cstb.

The third switching element Qc, which is also the three-terminal element of the thin film transistor or the like provided in the lower display panel 100, has a control terminal connected to the gate line GLn+1 of the next stage, an input terminal connected to the second liquid crystal capacitor Clcb, and an output terminal connected to the auxiliary capacitor Cas.

One side terminal of the auxiliary capacitor Cas is connected to the output terminal of the third switching element Qc and the other side terminal thereof is connected to the sustain electrode line SL.

An operation of the liquid crystal display according to an exemplary embodiment of the present inventive concept will be described. When a gate ON voltage is applied to the gate line GLn, the first switching element and the second switching element Qa and Qb connected to the gate line GLn are turned on, and the data voltage of the data line 171 is applied to the first and second sub-pixel electrodes.

Next, when a gate OFF voltage is applied to the gate line GLn and the gate ON voltage is applied to the gate line GLn+1 of the next stage, the first and second switching elements Qa and Qb are turned off and the third switching element Qc is turned on. Therefore, charges in the second sub-pixel electrode connected to the output terminal of the second switching element Qb flow into the auxiliary capacitor Cas, such that a voltage of the second liquid crystal capacitor Clcb drops.

As such, the charged voltages of the first and second liquid crystal capacitors Clca and Clcb are formed to be different from each other, such that side visibility of the liquid crystal display may be improved.

Figure 15:
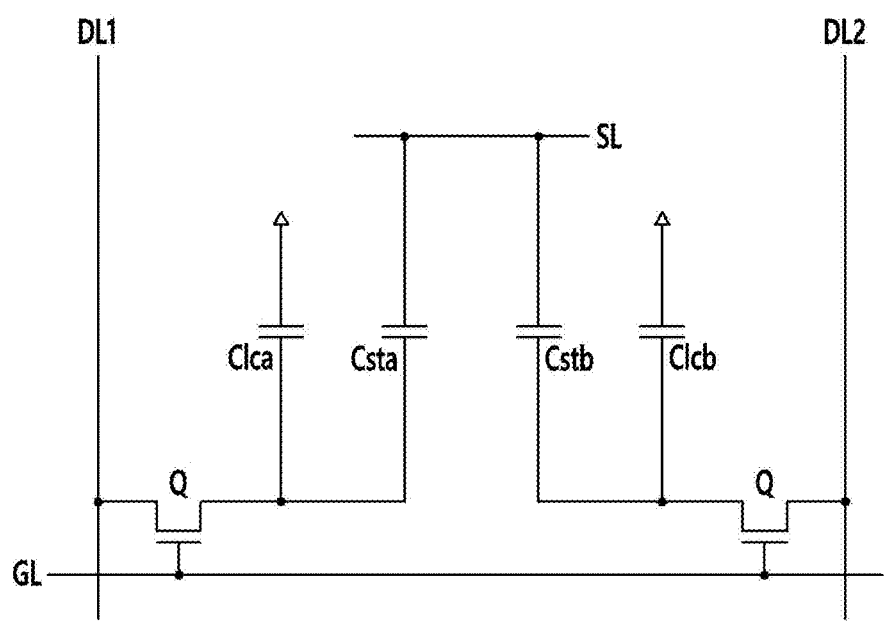

Hereinafter, an exemplary embodiment of FIG. 15 will be described.

The liquid crystal display according to an exemplary embodiment of the present inventive concept includes a signal line including a plurality of gate lines GL, a plurality of data lines DL1 and DL2, and a plurality of sustain electrode lines SL, and a plurality of pixels PXs connected to the signal line. Each pixel PX includes a pair of first and second liquid crystal capacitors Clca and Clcb and first and second sustain capacitors Csta and Cstb.

Each sub-pixel includes one liquid crystal capacitor and one sustain capacitor, and additionally includes one thin film transistor Q. The thin film transistor Q of two sub-pixels that belong to one pixel is connected to the same gate line GL, but is connected to different data lines DL1 and DL2. The different data lines DL1 and DL2 simultaneously apply different levels of data voltages to the first and second liquid crystal capacitors Clca and Clcb of the two sub-pixels so as to have the charged voltages different from each other. As a result, side visibility of the liquid crystal display may be improved.

Hereinafter, an exemplary embodiment of FIG. 16 will be described.

Figure 16:
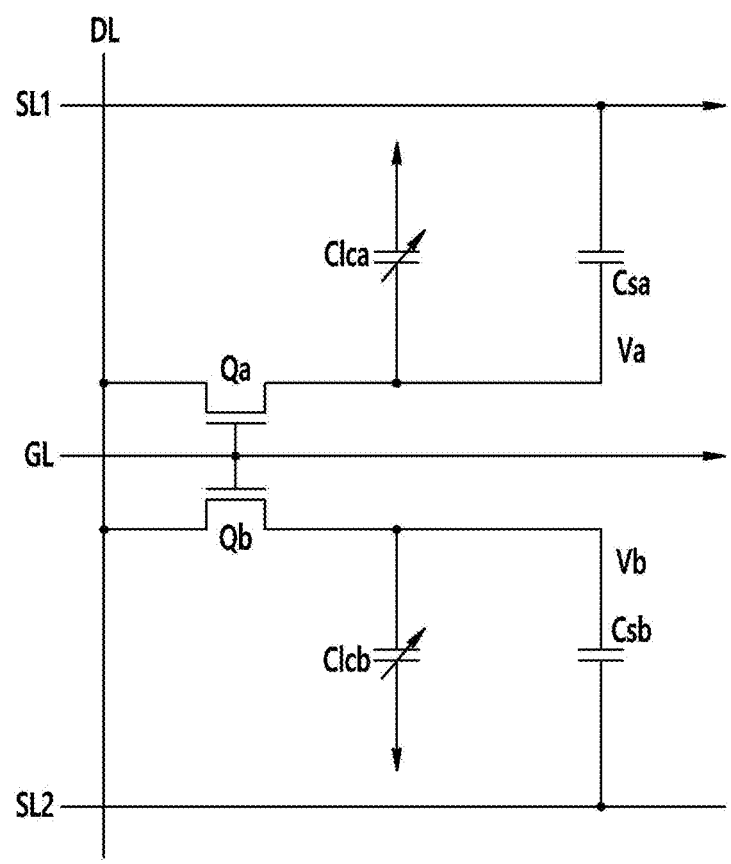

The liquid crystal display according to an exemplary embodiment of the present inventive concept includes a gate line GL, a data line DL, a first power line SL1, a second power line SL2, and a first switching element Qa and a second switching element Qb which are connected to the gate line GL and the data line DL, as shown in FIG. 16.

The liquid crystal display according to an exemplary embodiment of the present inventive concept further includes an auxiliary step-up capacitor Csa and a first liquid crystal capacitor Clca which are connected to the first switching element Qa, and an auxiliary step-down capacitor Csb and a second liquid crystal capacitor Clcb which are connected to the second switching element Qb.

The first switching element Qa and the second switching element Qb are configured by the three-terminal element of the thin film transistor, or the like. The first switching element Qa and the second switching element Qb are connected to the same gate line GL and the same data line DL, so as to be turned on at the same timing and output the same data signal.

The first power line SL1 and the second power line SL2 are applied with voltages which are swung at a predetermined period. The first power line SL1 is applied with a first low voltage during a predetermined period (e.g., 1 H) and is applied with a first high voltage during a next predetermined period. The second power line SL2 is applied with a second high voltage during a predetermined period and is applied with a second low voltage during a next predetermined period. In this case, the first period and the second period are repeated multiple times during one frame, such that the first power line SL1 and the second power line SL2 are applied with the swung voltages. In this case, the first low voltage and the second low voltage may be the same and the first high voltage and the second high voltage may also be the same.

The auxiliary step-up capacitor Csa is connected to the first switching element Qa and the first power line SL1 and the auxiliary step-down capacitor Csb is connected to the second switching element Qb and the second power line SL2.

A voltage Va of a terminal (hereinafter, referred to as 'first terminal') of a portion that the auxiliary step-up capacitor Csa is connected to the first switching element Qa is decreased when the first low voltage is applied to the first power line SL1 and is increased when the first high voltage is applied to the first power line SL1. Then, as the voltage of the first power line SL1 is swung, the voltage Va of the first terminal is also swung.

In addition, a voltage Vb of a terminal (hereinafter, referred to as 'second terminal') of a portion that the auxiliary step-down capacitor Csb is connected to the second switching element Qb is increased when the second high voltage is applied to the second power line SL2 and is decreased when the second low voltage is applied to the second power line SL2. Then, as the voltage of the second power line SL2 is swung, the voltage Vb of the second terminal is also swung.

As such, since the voltages Va and Vb of the pixel electrodes of the two sub-pixels are changed depending on magnitude of the swung voltage in the first and second power lines SL1 and SL2 even in the case in which the same data voltage is applied to the two sub-pixels, transmittance of the two sub-pixels may be different and side visibility may be improved, accordingly.

Although the reference voltage line is not used in the exemplary embodiments of FIGS. 13 to 16, display quality is improved by forming the reference voltage line so as to vertically traverse the center of a display area of the pixel using any line which is parallel to the data line.

It will be obvious to those skilled in the art to which the present inventive concept pertains that the present inventive concept described above is not limited to the above-mentioned exemplary embodiments and the accompanying drawings, but may be variously substituted, modified, and altered without departing from the scope and spirit of the present inventive concept.

What is claimed is:

1. A thin film transistor display panel, comprising:
a first substrate; and
a first pixel electrode and a second pixel electrode formed on the first substrate and disposed to be adjacent to each other in a column direction,
wherein the first pixel electrode includes a first sub-pixel electrode and a second sub-pixel electrode, each of the first sub-pixel electrode and the second sub-pixel electrode including a vertical stem part, a horizontal stem part connected to a center of the vertical stem part, and a plurality of minute branches,
the second pixel electrode includes a third sub-pixel electrode and a fourth sub-pixel electrode, each of the third sub-pixel electrode and the fourth sub-pixel electrode including a vertical stem part, a horizontal stem part connected to a center of the vertical stem part, and a plurality of minute branches,
all the plurality of minute branches of the second sub-pixel electrode and all the plurality of minute branches of the third sub-pixel electrode that are adjacent to each other in the column direction form an angle greater than or equal to 45° and less than or equal to 135°,
the first sub-pixel electrode, the second sub-pixel electrode, the third sub-pixel electrode, and the fourth sub-pixel electrode each include a first horizontal stem part and a second horizontal stem part that extend in a horizontal direction, and a plurality of minute branches that extend in a diagonal direction from both sides of each horizontal stem part,
a first vertical stem part which is perpendicular to the first horizontal stem part is formed at one end of the first horizontal stem part of each of the first sub-pixel electrode, the second sub-pixel electrode, the third sub-pixel electrode, and the fourth sub-pixel electrode,
a second vertical stem part which is perpendicular to the second horizontal stem part is formed at one end of the second horizontal stem part, and
the first vertical stem part and the second vertical stem part in each of the first sub-pixel electrode, the second sub-pixel electrode, the third sub-pixel electrode, and the fourth sub-pixel electrode are formed at opposite sides of the first sub-pixel electrode, the second sub-pixel electrode, the third sub-pixel electrode, and the fourth sub-pixel electrode, respectively.

2. The thin film transistor display panel of claim 1, further comprising:
a first gate line and a second gate line formed on the first substrate, the first gate line and the second gate line being disposed adjacent to each other in the column direction;
a gate insulating layer formed on the first gate line and the second gate line;
a semiconductor layer formed on the gate insulating layer;
a data line and a drain electrode formed on the semiconductor layer; and
a passivation layer covering the data line and the drain electrode and having a contact hole exposing a portion of the drain electrode,
wherein the first sub-pixel electrode is disposed above the first gate line and the second sub-pixel electrode is disposed below the first gate line in a plan view, and
the third sub-pixel electrode is disposed above the second gate line and the fourth sub-pixel electrode is disposed below the second gate line in a plan view.

3. The thin film transistor display panel of claim 1, wherein:
the second vertical stem part of the second sub-pixel electrode and the first vertical stem part of the third sub-pixel electrode are disposed on a same side of the first pixel electrode and the second pixel electrode, respectively.

4. The thin film transistor display panel of claim 3, wherein:
the second vertical stem part of the third sub-pixel electrode and the first vertical stem part of the fourth sub-pixel electrode are disposed on a same side of the second pixel electrode.

5. The thin film transistor display panel of claim 3, wherein:
the second vertical stem part of the third sub-pixel electrode and the first vertical stem part of the fourth sub-pixel electrode are disposed on opposite sides of the second pixel electrode.

6. The thin film transistor display panel of claim 1, wherein:
a portion of the plurality of minute branches extending from the first horizontal stem part and a portion of the plurality of minute branches extending from the second horizontal stem part are connected to each other.

7. The thin film transistor display panel of claim 1, wherein:
the plurality of minute branches extend in a direction away from all of the first vertical stem parts and the second vertical stem parts.

8. The thin film transistor display panel of claim 1, wherein:
ends of the plurality of minute branches are connected to each other.

9. The thin film transistor display panel of claim 8, wherein:
all of the ends of the plurality of plurality of minute branches are connected to each other.

10. The thin film transistor display panel of claim 1, wherein:
the first pixel electrode and the second pixel electrode have an interval greater than or equal to 2 and less than or equal to 10 nm.

11. The thin film transistor display panel of claim 1, wherein:
the plurality of minute branches of the second sub-pixel electrode and the plurality of minute branches of the third sub-pixel electrode are formed in a misaligned shape.

12. A liquid crystal display, comprising:
a first substrate;
a first pixel electrode and a second pixel electrode formed on the first substrate and disposed to be adjacent to each other in a column direction;
a second substrate corresponding to the first substrate;
a common electrode on the second substrate; and
a liquid crystal layer formed between the first substrate and the second substrate,
wherein the first pixel electrode includes a first sub-pixel electrode and a second sub-pixel electrode, each of the first sub-pixel electrode and the second sub-pixel electrode including a vertical stem part, a horizontal stem part connected to a center of the vertical stem part, and a plurality of minute branches,
the second pixel electrode includes a third sub-pixel electrode and a fourth sub-pixel electrode, each of the third sub-pixel electrode and the fourth sub-pixel electrode including a vertical stem part, a horizontal stem part connected to a center of the vertical stem part, and a plurality of minute branches,
all the plurality of minute branches of the second sub-pixel electrode and all the plurality of minute branches of the third sub-pixel electrode that are adjacent to each other in the column direction form an angle greater than or equal to 45° and less than or equal to 135°,
the first sub-pixel electrode, the second sub-pixel electrode, the third sub-pixel electrode, and the fourth sub-pixel electrode each include a first horizontal stem part and a second horizontal stem part that extend in a horizontal direction, and a plurality of minute branches that extend in a diagonal direction from both sides of each horizontal stem part,
a first vertical stem part which is perpendicular to the first horizontal stem part is formed at one end of the first horizontal stem part of each of the first sub-pixel electrode, the second sub-pixel electrode, the third sub-pixel electrode, and the fourth sub-pixel electrode,
a second vertical stem part which is perpendicular to the second horizontal stem part is formed at one end of the second horizontal stem part, and
the first vertical stem part and the second vertical stem part in each of the first sub-pixel electrode, the second sub-pixel electrode, the third sub-pixel electrode, and the fourth sub-pixel electrode are formed at opposite sides of the first sub-pixel electrode, the second sub-pixel electrode, the third sub-pixel electrode, and the fourth sub-pixel electrode, respectively.

13. The liquid crystal display of claim 12, wherein:
the second vertical stem part of the second sub-pixel electrode and the first vertical stem part of the third sub-pixel electrode are disposed on a same side of the first pixel electrode and the second pixel electrode, respectively.

14. The liquid crystal display of claim 13, wherein:
the second vertical stem part of the third sub-pixel electrode and the first vertical stem part of the fourth sub-pixel electrode are disposed on a same side of the second pixel electrode.

15. The liquid crystal display of claim 13, wherein:
the second vertical stem part of the third sub-pixel electrode and the first vertical stem part of the fourth sub-pixel electrode are disposed on opposite sides of the second pixel electrode.

16. The liquid crystal display of claim 12, wherein:
the plurality of minute branches extend in a direction which extends away from all of the first vertical stem parts and the second vertical stem parts.

* * * * *